United States Patent [19]
Haronian

[11] Patent Number: 6,128,961
[45] Date of Patent: Oct. 10, 2000

[54] MICRO-ELECTRO-MECHANICS SYSTEMS (MEMS)

[76] Inventor: Dan Haronian, P.O. Box 2091, 90435 Efrat, Israel

[21] Appl. No.: 09/101,014

[22] PCT Filed: Dec. 24, 1996

[86] PCT No.: PCT/IL96/00190

§ 371 Date: Aug. 24, 1998

§ 102(e) Date: Aug. 24, 1998

[87] PCT Pub. No.: WO97/24915

PCT Pub. Date: Jul. 17, 1997

[30] Foreign Application Priority Data

Dec. 24, 1995 [IL] Israel .......................................... 116536

[51] Int. Cl.[7] ......................................................... G01B 7/16
[52] U.S. Cl. ................................................. 73/774; 73/777
[58] Field of Search ........................... 73/763, 768, 774, 73/777, 780, 718, 721

[56] References Cited

U.S. PATENT DOCUMENTS

| | | |
|---|---|---|
| 5,115,292 | 5/1992 | Takebe et al. . |
| 5,357,807 | 10/1994 | Guckel et al. . |
| 5,381,696 | 1/1995 | Ichinose et al. . |
| 5,656,785 | 8/1997 | Trainor et al. ......................... 73/862.46 |
| 5,661,235 | 8/1997 | Bonin ........................................ 73/105 |

FOREIGN PATENT DOCUMENTS

| | | |
|---|---|---|
| 63-116478 | 11/1989 | Japan . |
| 05227590 | 9/1993 | Japan . |

OTHER PUBLICATIONS

Haronian, D., et al., Sensors and Actuators 53:288–298, 1996.
Rogers, E., J. Acoustical Society of Ame., 34:883–893, 1962.
Puers, B., et al., IEEE Transactions on Electron Devices, 35:764–770, 1988.
Kuhnel, W., Sensors and Actuators, 25:521–525, 1991.
Bassous, E., IEEE Transactions on Electron Devices, 25:1178–1185, 1978.
Shaw, K.A., et al., Sensors and Actuators, 40:63–70, 1994.
Li, Y.X., et al., MEMS'95, pp. 398–403, 1995.
Stoev, I.G., et al., Sensors and Actuators, 19:183–197, 1989.
Wu, X.P., et al., Sensors and Actuators, 2:309–320, 1982.
Wortman, J.J., et al., J. Applied Physics, 35:2122–2131, 1964.
Wortman, J.J., et al., J. Applied Physics, 37:3527–3530, 1966.
Goetzberger, A., et al., J. Applied Physics, 35:1851–1854, 1964.
Chaudhuri, A.R., et al., J. Applied Physics, 33:2736–2746, 1962.
Holland, M.G., et al., Physical Review, 128:30–38, 1962.
Nathan, M.I., et al., Physical Review, 128:38–42, 1962.
Mason, W.P., et al., J. Acustical Society of America, 29:1096–1101, 1957.
Zhao, G., J. Applied Physics, 73:1832–1837, 1993.
Hauser, J.R., Proc. of the IEEE, pp. 743–744, 1965.
Haronian, D., et al., J. Micromech. Microeng., 5:289–296, 1995.
Tran A.T.T.D., et al., IEEE Photonics Technology Letters, 8:393–395, 1996.
Benitez, A., et al., MEMS '95, pp. 404–407, 1995.
Sikorski M.E., et al., Rev. Sci. Instrum., 33:1130–1131, 1962.

*Primary Examiner*—Max Noori
*Attorney, Agent, or Firm*—Mark M. Friedman

[57] ABSTRACT

A microelectronics deformation sensor including at least one stress sensor directly integrated on at least one of an extremity of a supported deformable structure and a support of the deformable structure, the deformable structure being constructed of a single crystal material, the at least one stress sensor sensing a stress in a vicinity of the extremity and thereby sensing a deformation of the deformable structure.

27 Claims, 24 Drawing Sheets

FIG. 6B
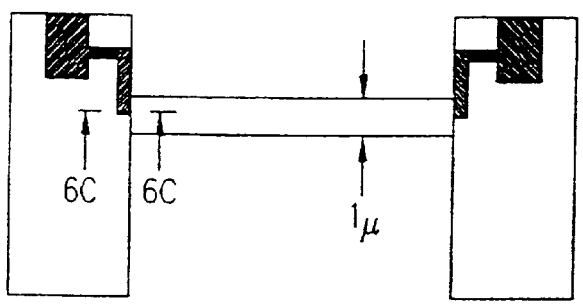
FIG. 6A
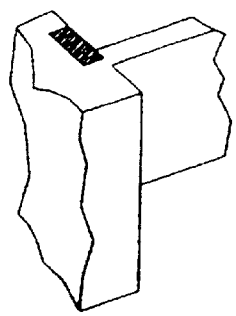
SCHOTTKY JUNCTION
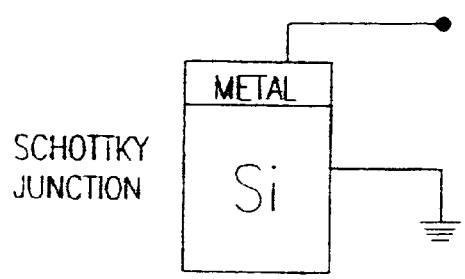
FIG. 6C
FIG. 6E
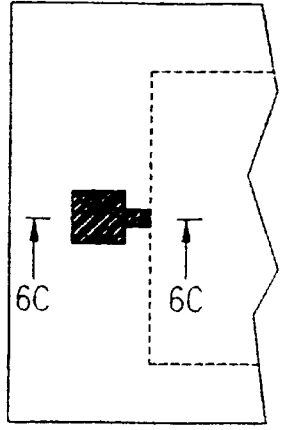
FIG. 6D
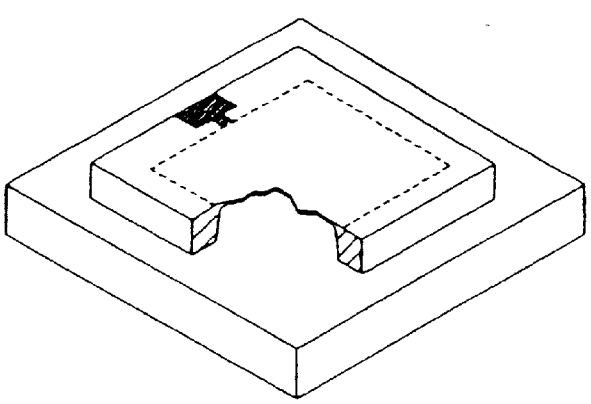

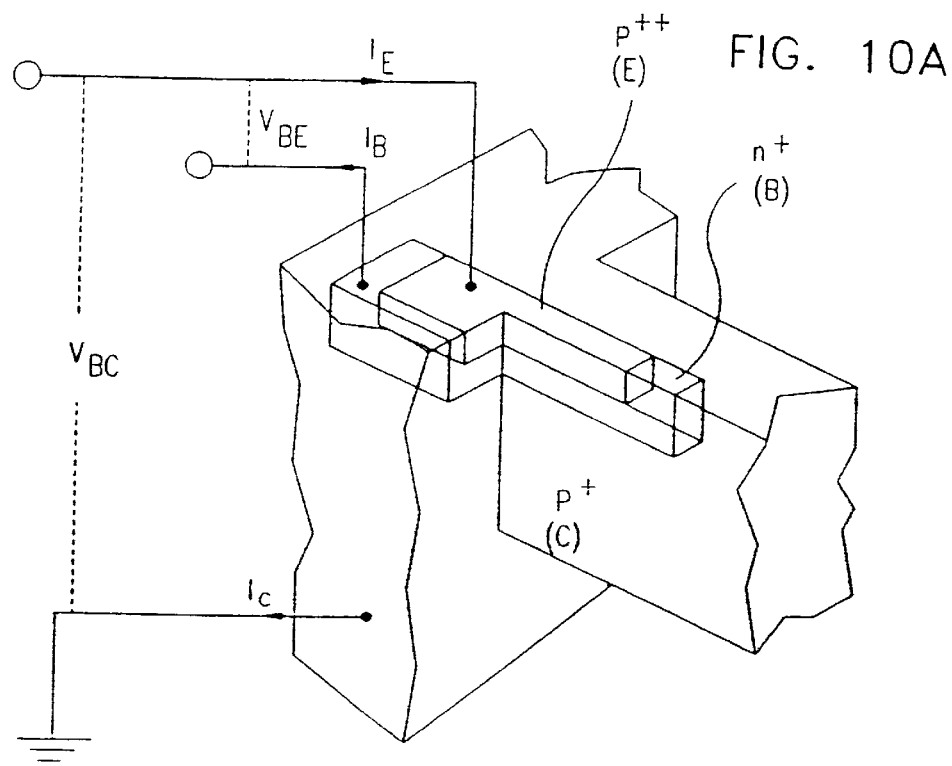
FIG. 10A
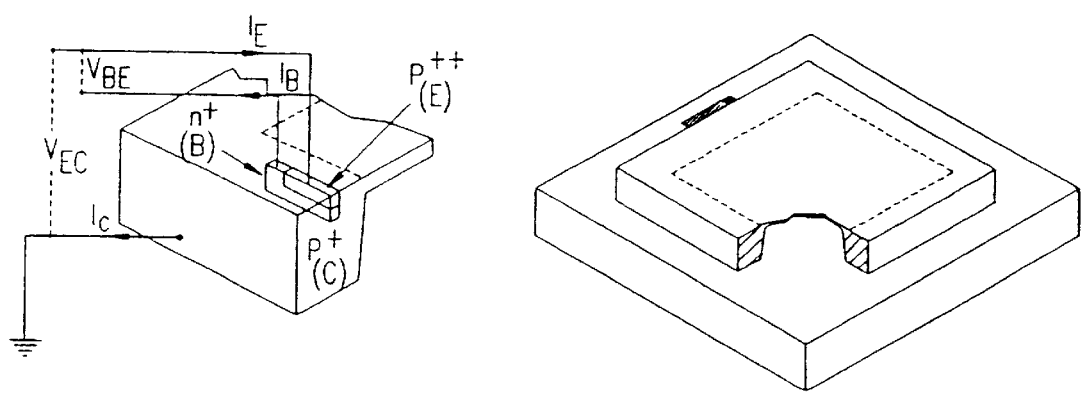
FIG. 10C
FIG. 10B

FIG. 13B
FIG. 13A
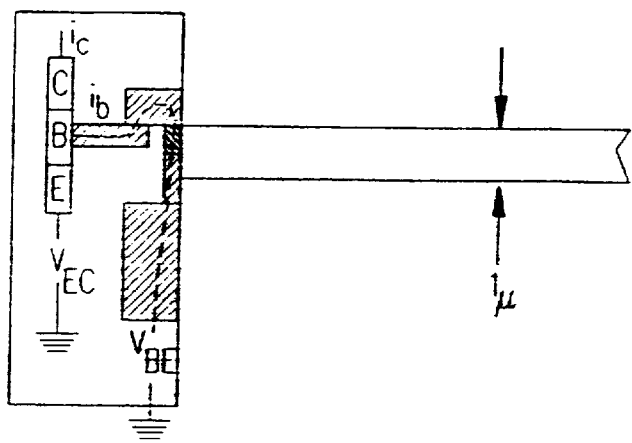
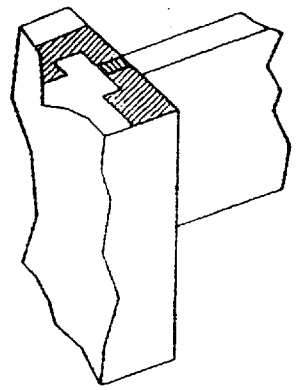
FIG. 13D
FIG. 13C
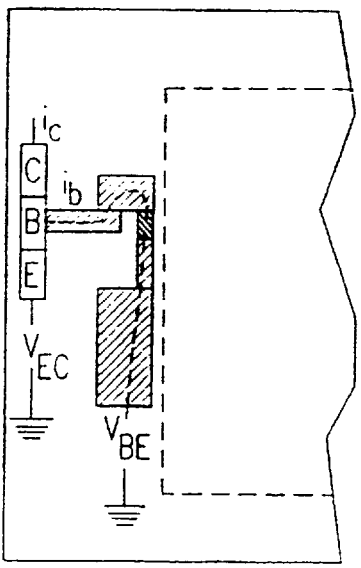
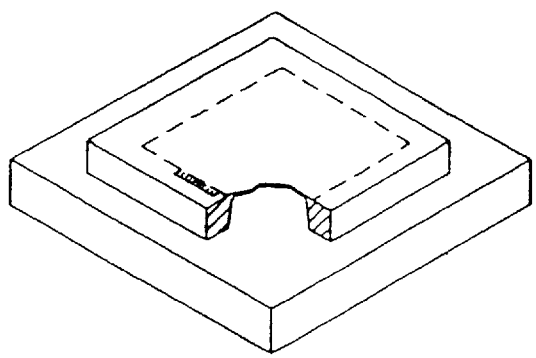

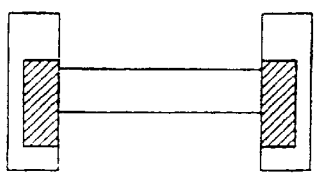
FIG. 19A
FIG. 19F
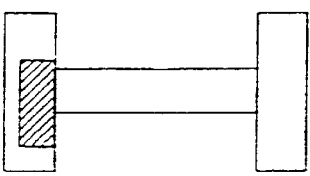
FIG. 19B
FIG. 19G
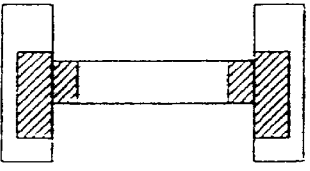
FIG. 19C
FIG. 19H
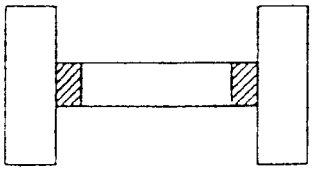
FIG. 19D
FIG. 19I
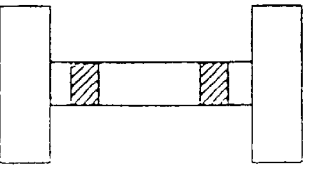
FIG. 19E FIG. 20H
FIG. 20I
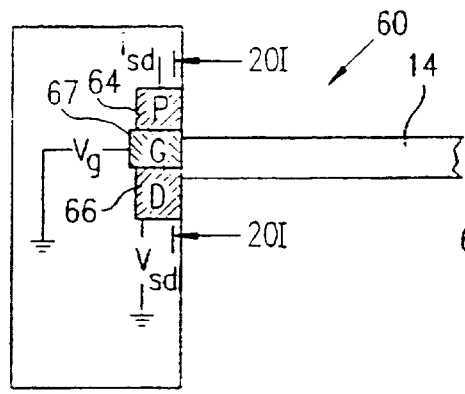
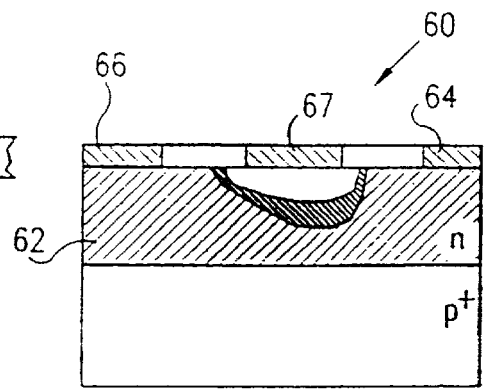
FIG. 21A
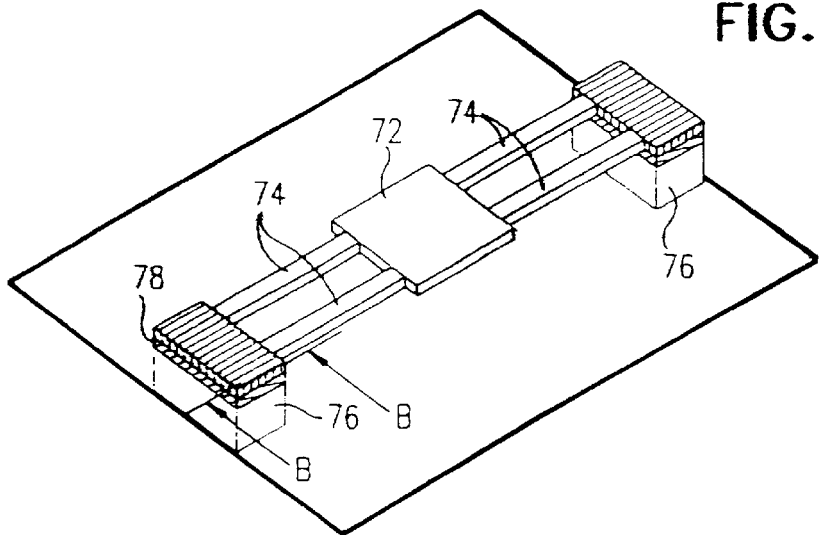
FIG. 21B
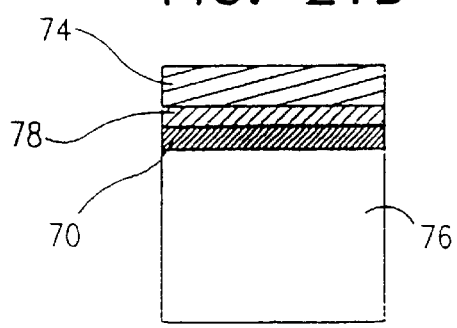

MICRO-ELECTRO-MECHANICS SYSTEMS (MEMS)

FIELD OF THE INVENTION

The present invention relates to Micro-Electro-Mechanics Systems (MEMS).

BACKGROUND OF THE INVENTION

Micro-Electro-Mechanics Systems (MEMS) are fabricated from metals such as aluminum, tungsten, nickel, etc. In addition MEMS are fabricated from polycrystal materials such as polysilicon and single crystal (SC) materials such as Single Crystal Silicon (SCS).

MEMS respond to their physical environment or act thereupon. It is important to be able to sense the behavior of MEMS in response to the environment. Sensors used conventionally to sense behavior of general electromechanical systems are capacitive, piezoresistive, piezoelectric, or optical. Other devices are known that use a floating gate in MOS configurations as a sensor. The sensing mechanisms used in the art may be classified into two broad categories: displacement sensors and stress sensors, i.e., sensors that sense the stress induced by the displacement. The capacitive, floating gate MOS, and optical sensors belong to the family of devices that sense the displacement directly. The piezoresistive and piezoelectric sensors belong to the family of stress sensors.

The sensing mechanism is not necessarily part of the device being sensed. Some examples are capacitance sensors, optical sensors and tunneling sensors. In capacitance sensing, the capacitance between a moving electrode and a stationary electrode is used as a sensing method. The electrodes are conductive or are coated with a conducting material. In optical sensing, the deflection of a structure is used to deflect light. Tunneling sensors use the tunneling current to sense the deflection of the moving part. The tunneling current and the light used in optical sensors are external to the mechanical phenomena, i.e., they are external to the deflection of the structure.

Piezoresistive sensors, on the other hand, are part of the device being sensed. Here the moving structure is designed so that its movement is translated into an electrical signal that is induced by the piezoresistive change of the structure itself.

A disadvantage of the displacement sensors is that in many cases (that is, capacitive, floating gate MOS) it is necessary to have a fixed structure in a close vicinity of the moving part. In some cases this fixed structure interferes with the measurement itself For example, in microphones the back electrode is the fixed structure, and the capacitance between this electrode and the membrane is used as a sensor. In general, the back electrode is too close to the membrane and thus damps the response of the microphone. In order to by-pass this problem, it is necessary to create perforations in the back electrode. This increases the complexity and cost of the device. Moreover, the abovementioned problems make these sensors impractical for MEMS.

In general sensing devices have small outputs. Therefore, it is necessary to feed the output signals into a preamplifier before they are further amplified. This adds an additional complexity and cost to the device, especially for MEMS.

The integration of transistors into devices for sensing purposes has been suggested. The electrical properties of a pn-junction in a tunnel diode were used to sense the response of microphones, as discussed in E. S. Rogers, "Experimental tunnel-diode electromechanical transducer elements and their use in tunnel-diode microphones," J. Acoust. Soc. Am., 34, 883-(1962). The electrical properties of transistors were used to sense the response of accelerometers, as discussed in M. E. Sikorski, P. Andreatch, A. Grieco, H. Christensen, "Transistor microphone", Rev. Sci. Instrum., 33, 1130-, (1962) and B. Puers, L. Reynaert, W. Snoeys, W. M. C. Sansen, "A new uniaxial accelerometer in silicon based on the piezojunction effect", IEEE Trans. Electron Device, ED-35, 764-, (1988).

In addition, a 'floating gate' in an MOS configuration was used as a sensing mechanism for a condenser microphone, as discussed in K. Kuehnel, "Silicon condenser microphone with integrated field effect transistor", Sensors and Actuators A, 25–27, 521–525, (1991).

However, the prior art does not discuss or teach integration of transistors with beams.

SUMMARY OF THE INVENTION

This patent addresses the direct integration of SCS based MEMS with sensing elements such as Schottky and junction diodes, piezoresistors, bipolar and MOSFET transistors. The integration is designed in such a way that a displacement of the device directly affects the electrical properties of the integrated sensing element. Furthermore, the stress also directly affects the electrical properties of the integrated sensing element, namely the charge mobility, the junction width, and the intrinsic concentration. Some of the sensing elements have a built-in gain, which is a very significant advantage over all sensing mechanisms that require amplification.

The present invention directly integrates conventional microelectronics devices with MEMS. The MEMS may be fabricated from Single Crystal (SC) materials, mainly Single Crystal Silicon (SCS), as well as non-crystalline materials. In a preferred embodiment of the present invention, a microelectronics based deformation sensing device is directly integrated with SC-MEMS in such a way that the mechanical deformation of elements in the MEMS modulates the electrical properties of the sensing device. This embodiment is advantageous for SC-MEMS, in particular SCS-MEMS, since these devices can be easily integrated on the same silicon wafer with conventional silicon technology. Sensors with in-plane and out-of-plane degree of freedom are disclosed. Other preferred embodiments of the present invention include integration of SCS beams, membranes and plates with Junction diode, Schottky diode, Bipolar transistors and MOSFET transistors. Theoretical issues of the technology are also discussed.

BRIEF DESCRIPTION OF DRAWINGS

The present invention will be understood and appreciated more fully from the following detailed description, taken in conjunction with the drawings in which.

Figure 4:
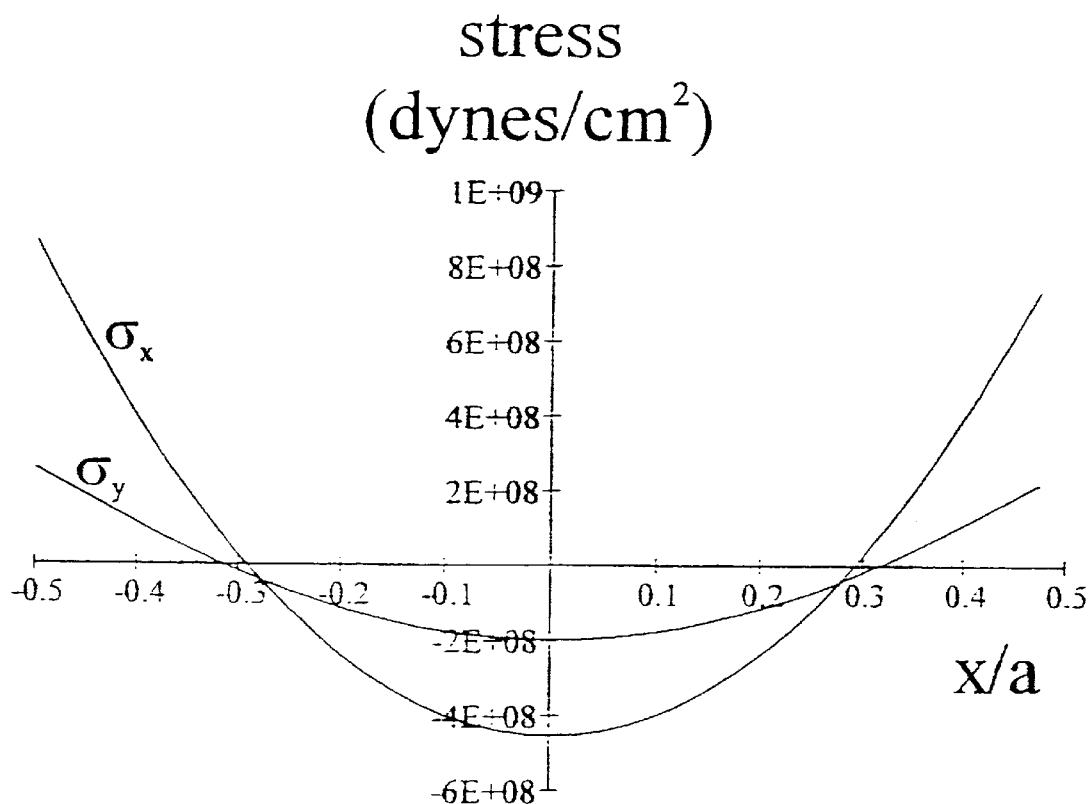
Figure 5:
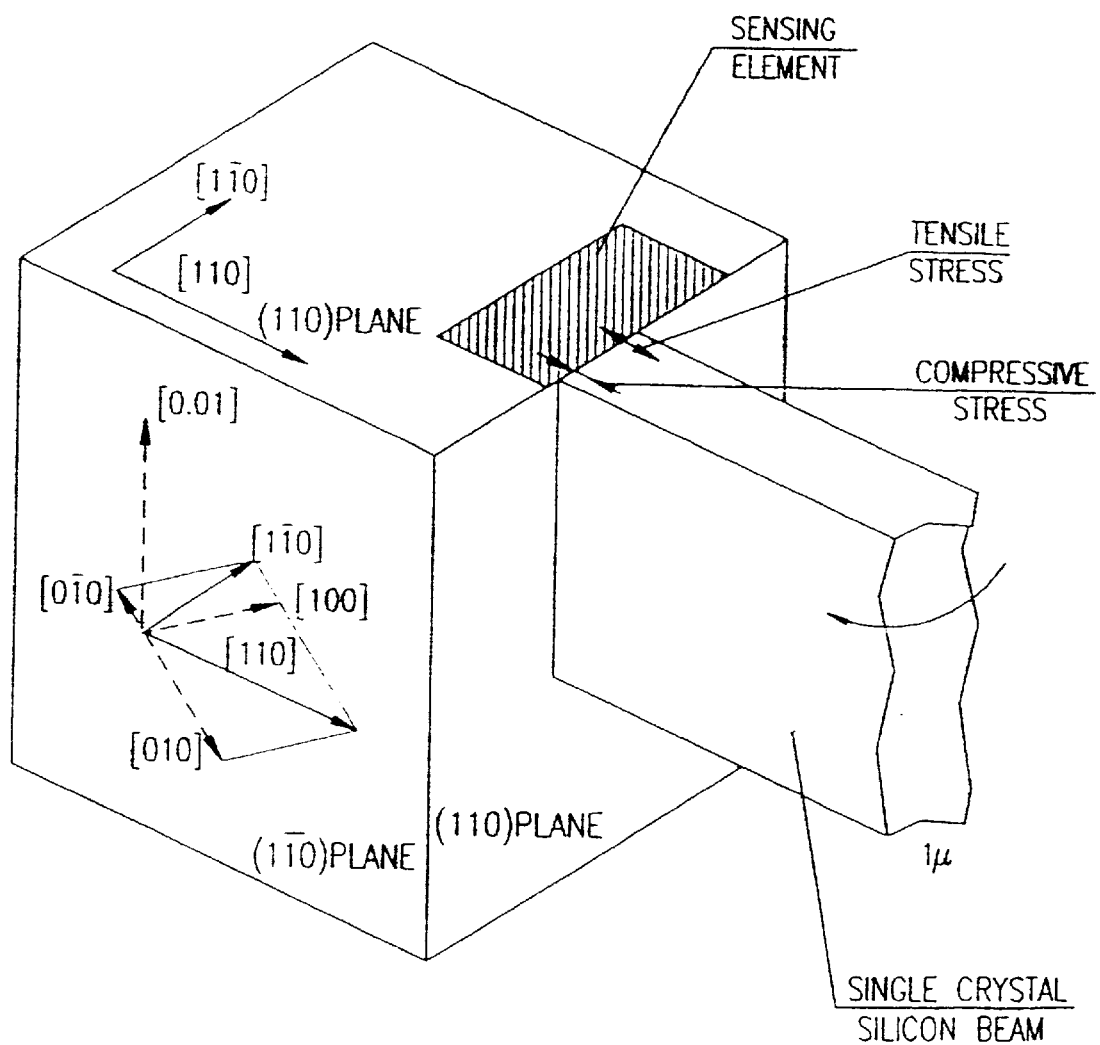
Figure 7B:
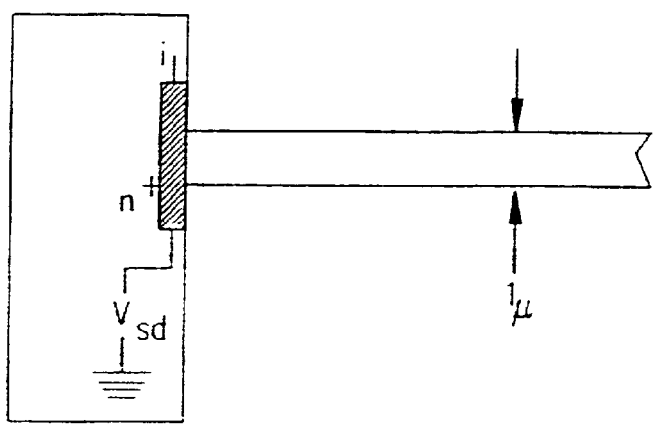
Figure 7A:
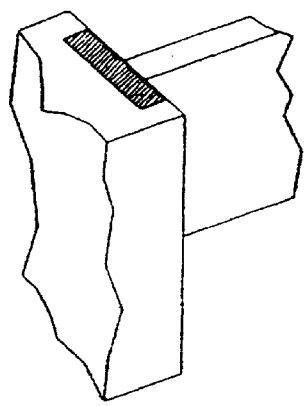
Figure 7D:
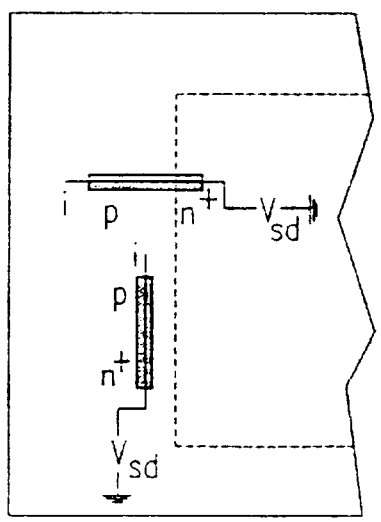
Figure 7C:
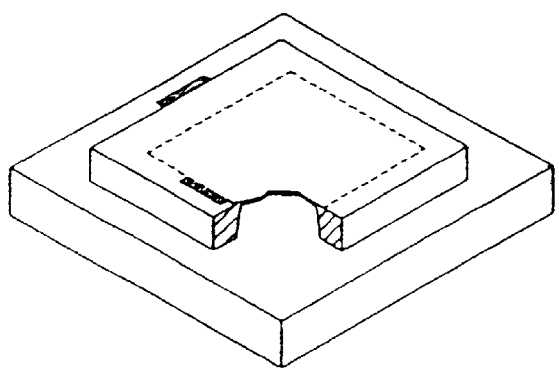
Figure 8A:
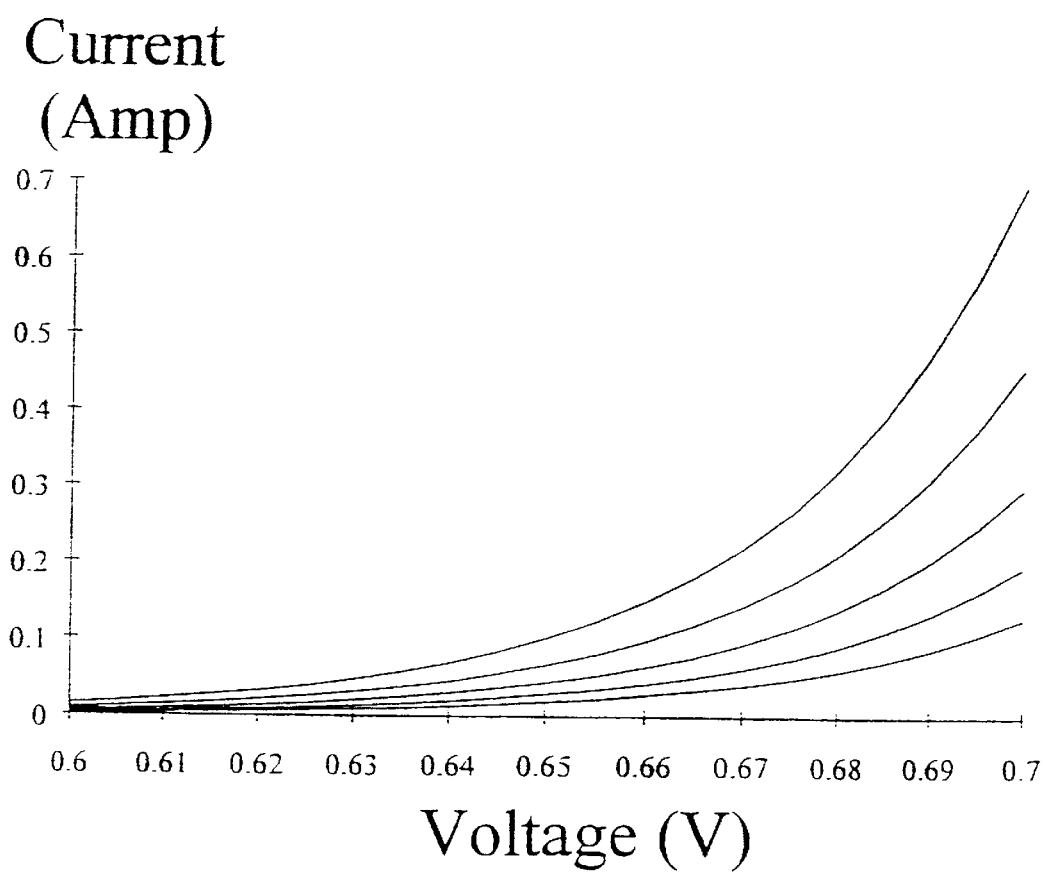

μm and, v=0.3 E=190 GPa where, h, a, b are the thickness, width, and length of the membrane respectively;

FIG. 4 is a simplified illustration of a stress distribution of a silicon membrane along its width with y=0, wherein the membrane dimensions are: h=15 μm, a=1000 μm, b=2000 μm and, v=0.3 E=190 GPa where, h, a, b are the thickness, width, and length of the membrane respectively;

FIG. 5 is a simplified illustration of crystallographic directions in a (001) wafer with reference to a SCS beam;

FIGS. 6A and 6B are simplified illustrations of an arrangement for a Schottky diode fabricated on the supports of a beam, FIG. 6A showing a portion of the beam pictorially and FIG. 6B showing a simplified side view;

FIG. 6C is a simplified sectional illustration of a portion of the Schottky diode of FIGS. 6A and 6B, taken along lines 6C—6C in FIG. 6B;

FIGS. 6D and 6E are simplified pictorial and top view illustrations, respectively, of an arrangement for a Schottky diode fabricated on the supports of a membrane;

FIGS. 7A and 7B are simplified pictorial and close-up illustrations of an arrangement for a junction diode fabricated on the supports of a beam;

FIGS. 7C and 7D are simplified pictorial and close-up illustrations of an arrangement for a junction diode fabricated on the supports of a membrane;

FIG. 8A is a simplified illustration of a diode current for different stress values as a function of the forward bias where $$\frac{qV}{2kT} \gg \text{Ln}\frac{(\tau_{p0}n_1 + \tau_{n0}p_1)}{n_i(\tau_{p0} + \tau_{n0})};$$

Figure 8B:
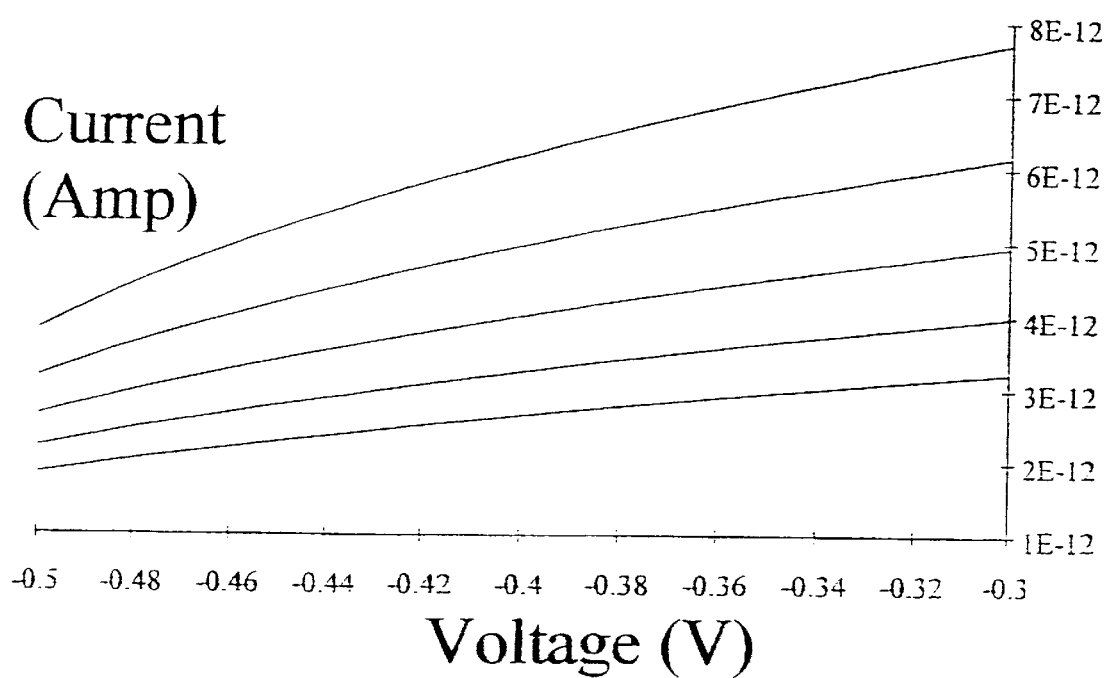
Figure 9:
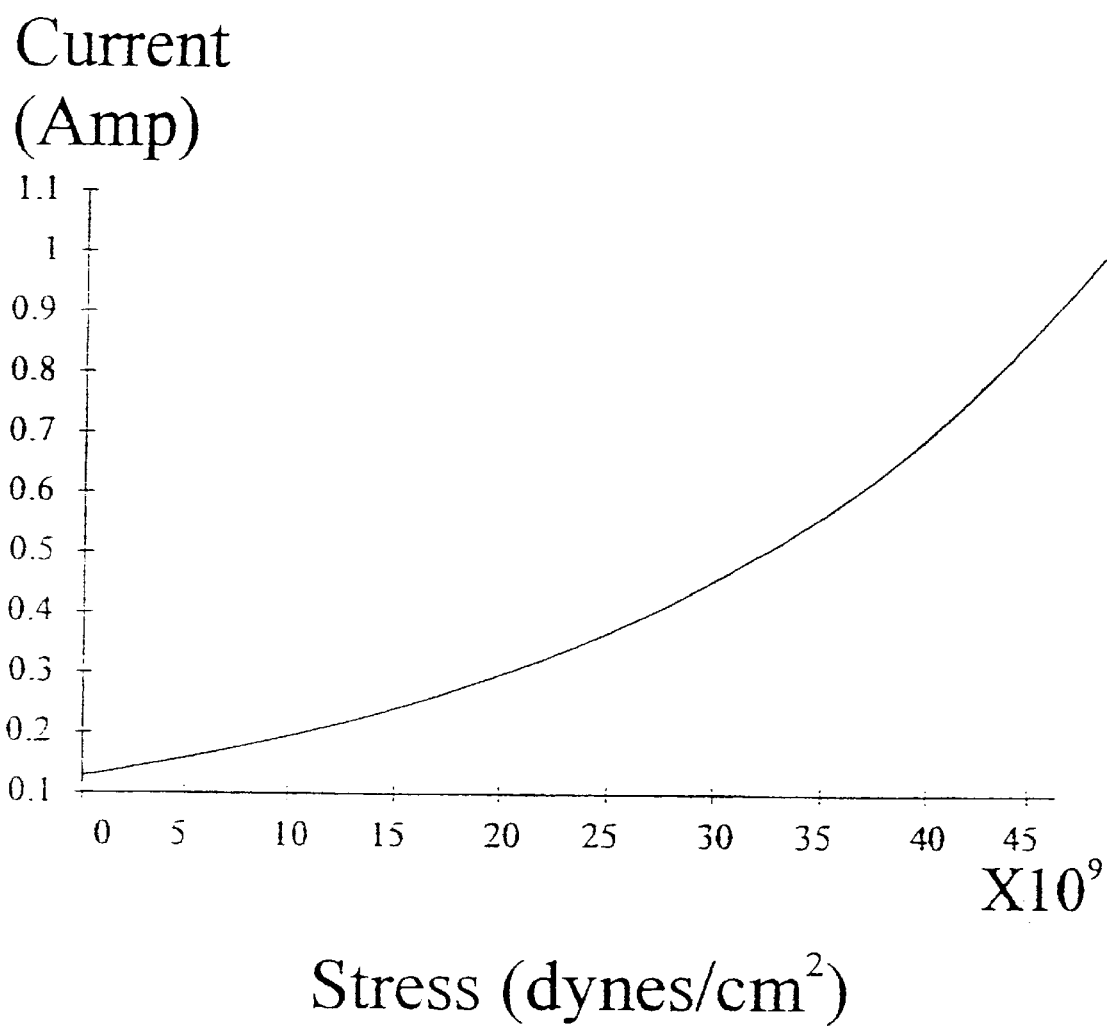
Figure 11:
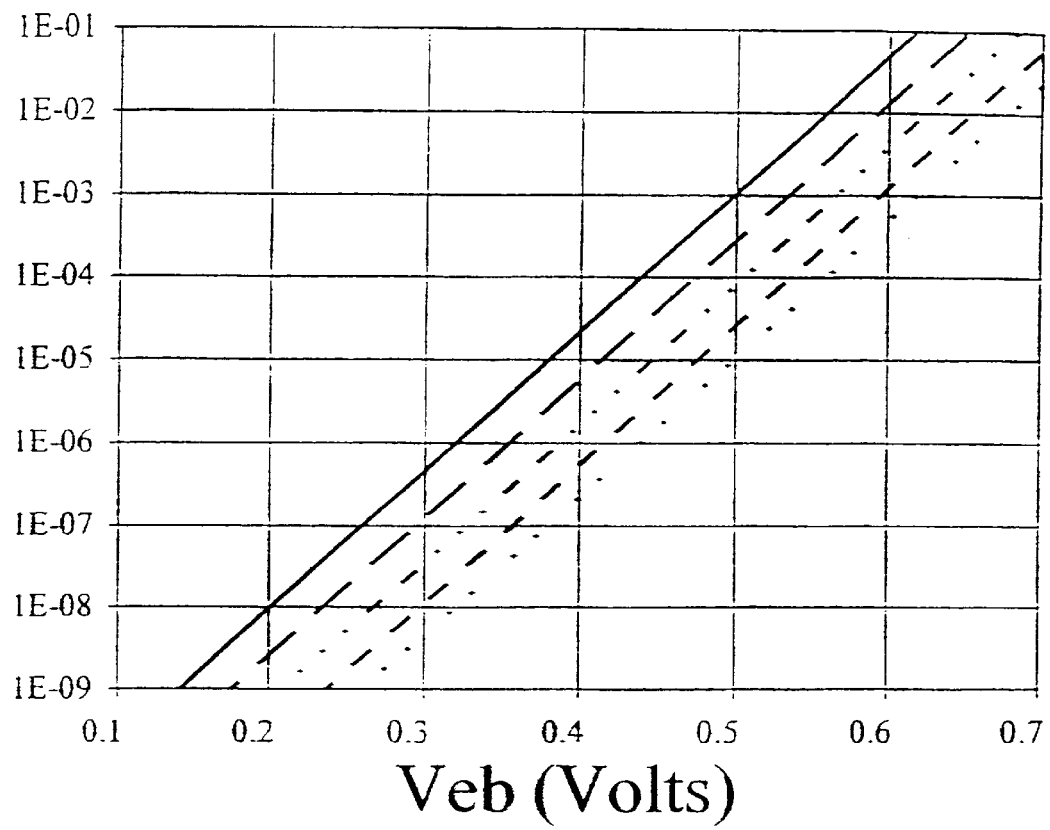
Figure 12:
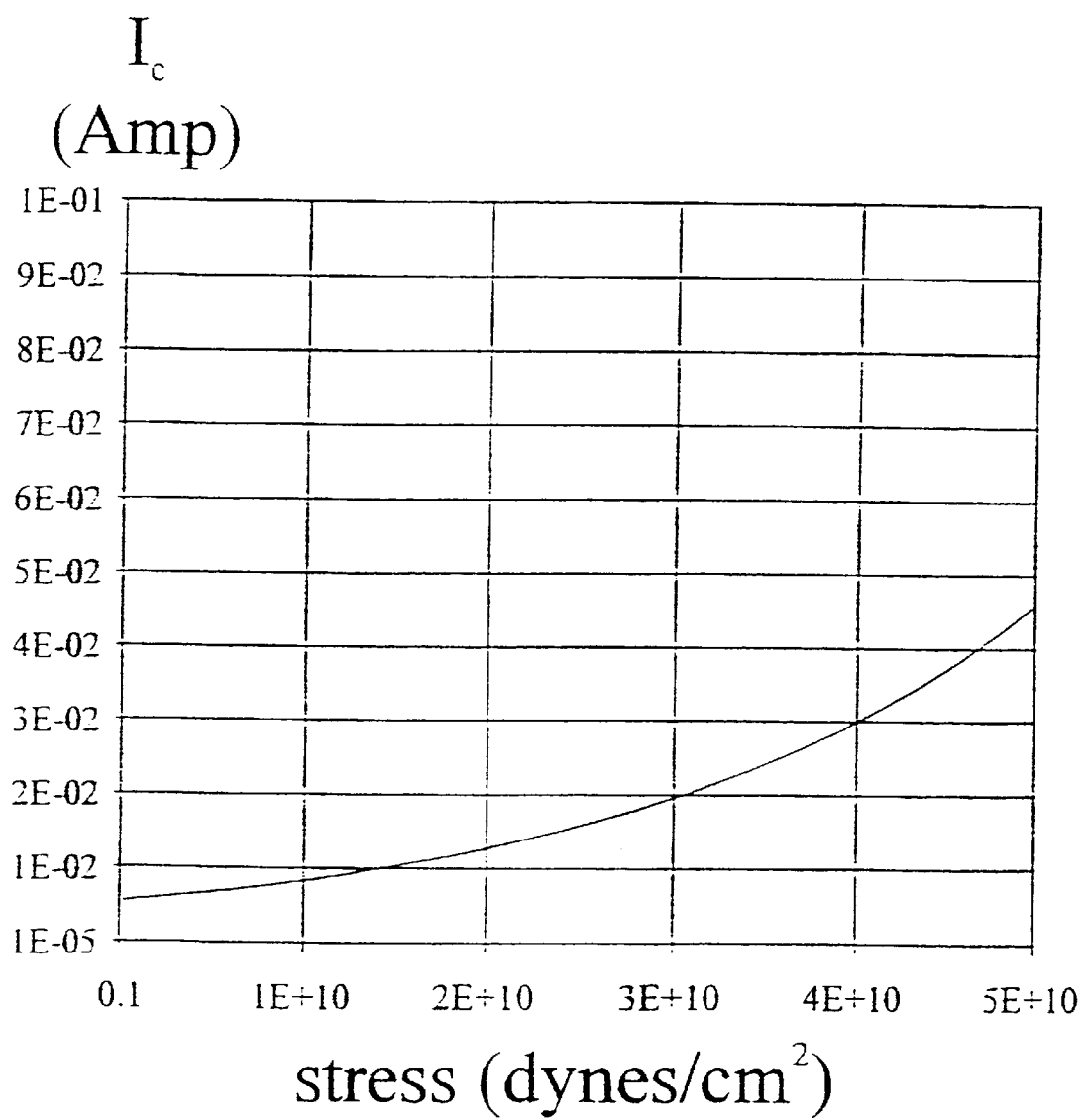
Figure 14:
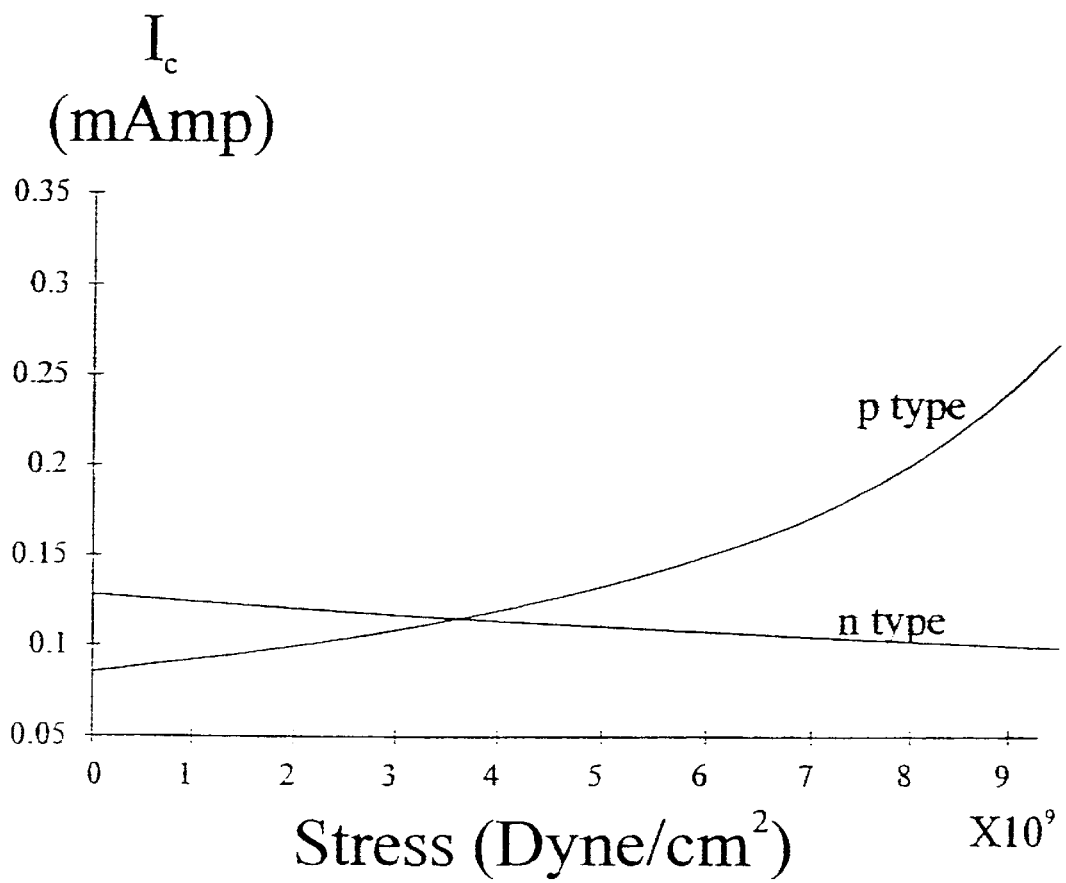
Figure 15:
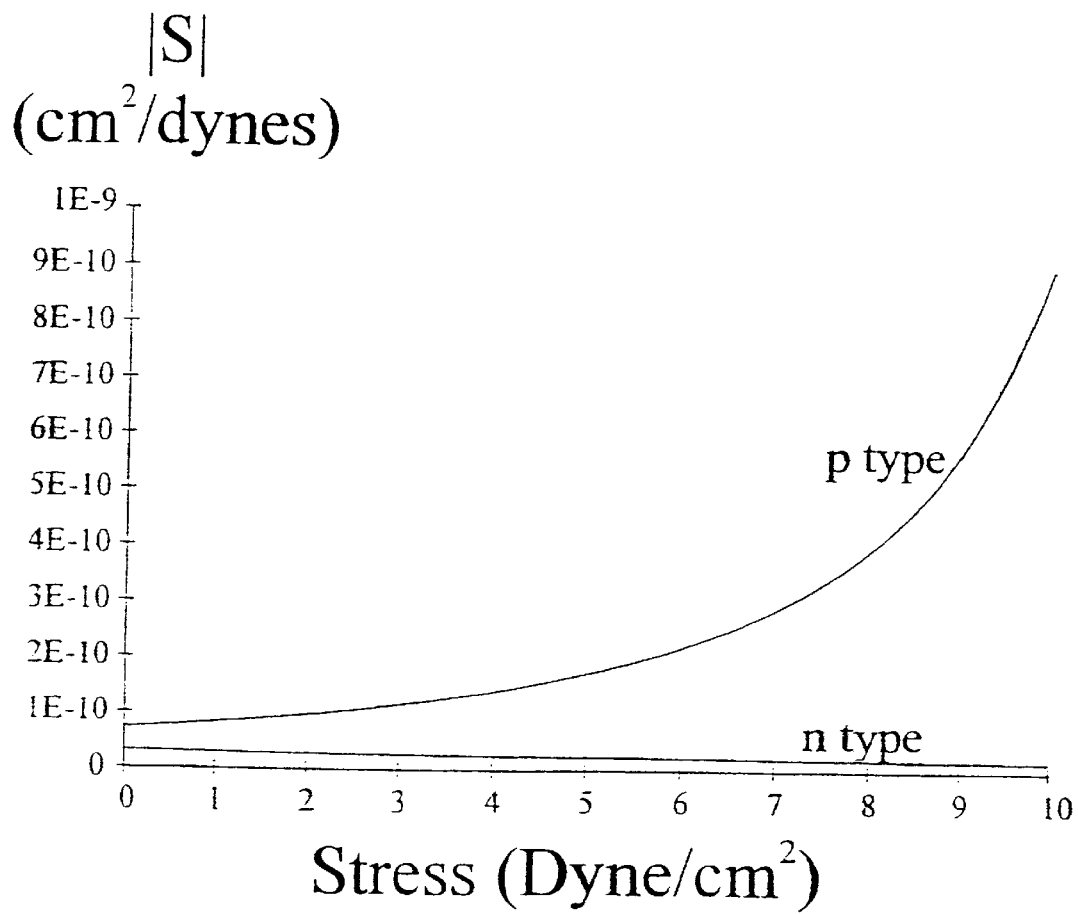
Figure 16B:
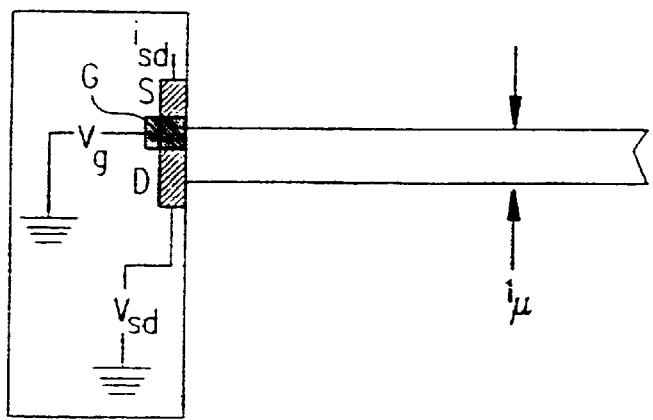
Figure 16A:
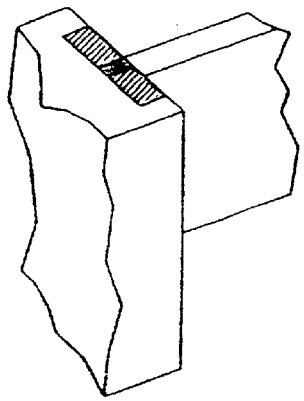
Figure 16D:
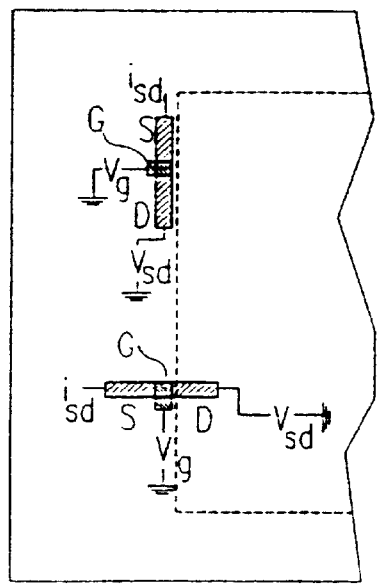
Figure 16C:
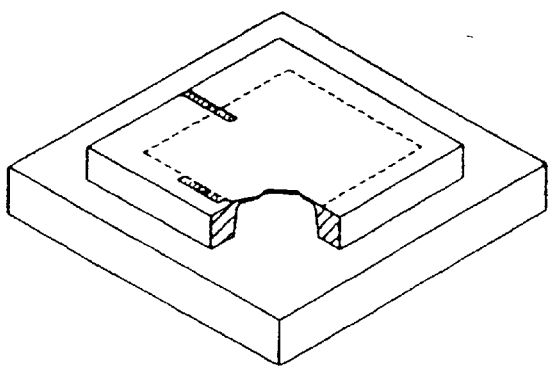
Figure 17A:
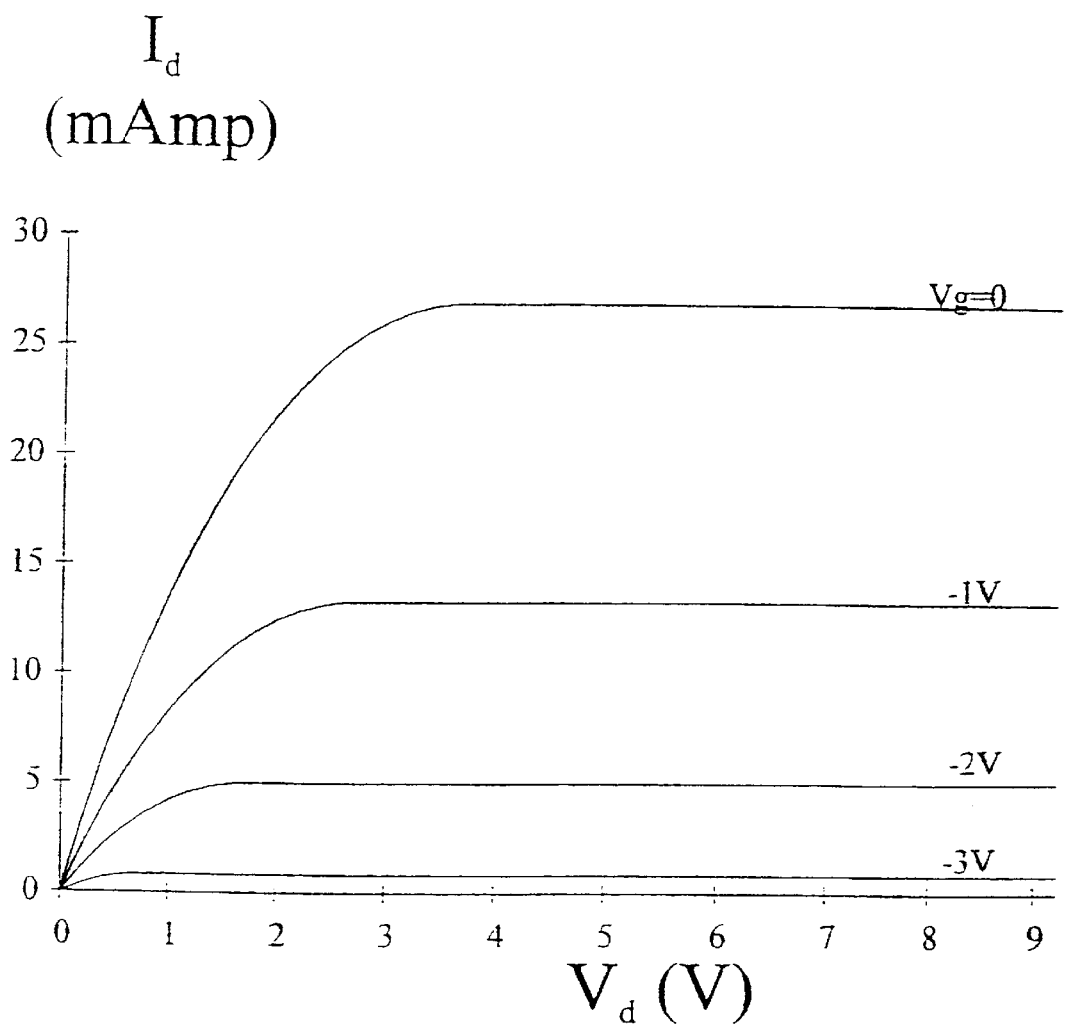
Figure 17B:
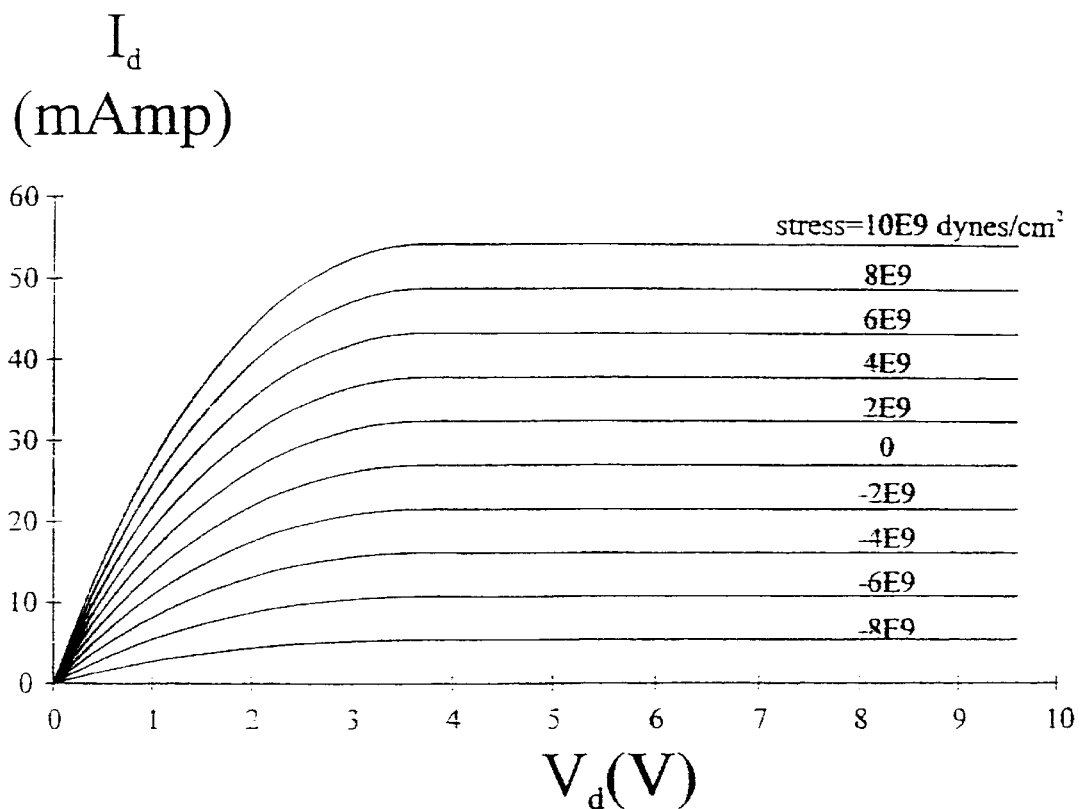
Figure 18:
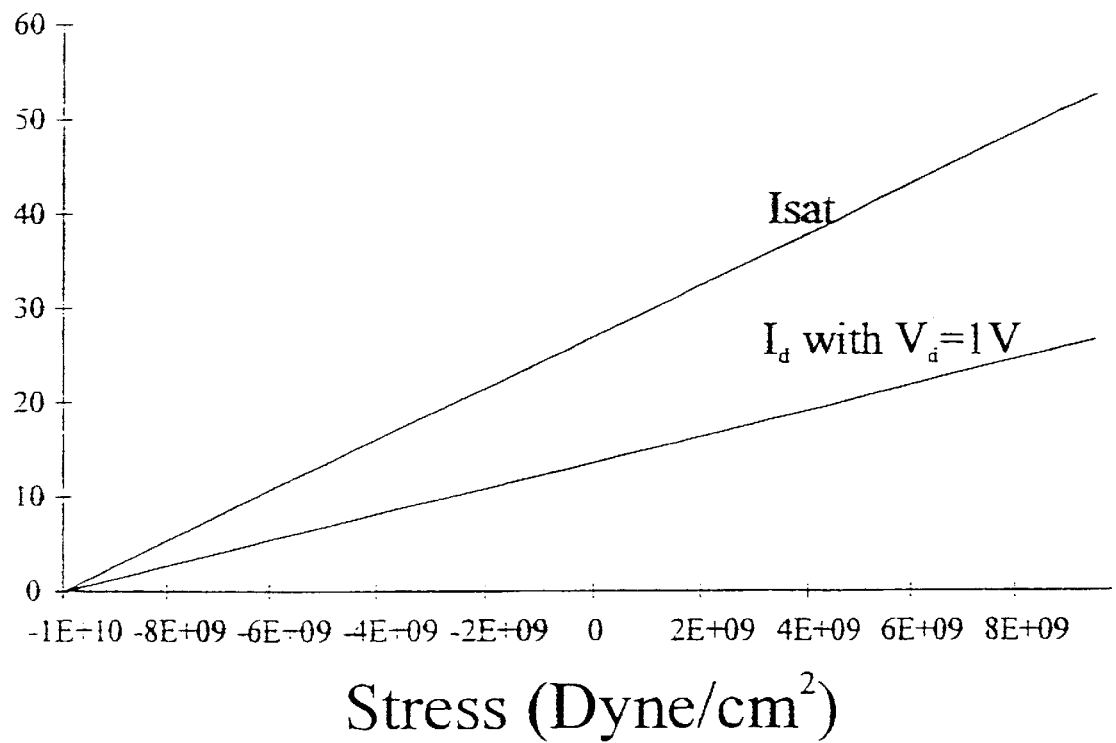

FIG. 8B is a simplified illustration of a diode current for different stress values as a function of the reverse bias where qV<<kT;

FIG. 9 is a simplified illustration of a diode current as a function of the stress for V=0.7V;

FIG. 10A is a simplified illustration of an arrangement for a bipolar transistor fabricated on the supports of a beam;

FIGS. 10B and 10C are simplified pictorial and close-up illustrations, respectively, of an arrangement for a bipolar transistor fabricated on the supports of a membrane;

FIG. 11 is a simplified illustration of a collector current for different stress values as a function of $V_{eb}$;

FIG. 12 is a simplified illustration of a collector current as a function of the stress for $V_{eb}$=0.5;

FIGS. 13A and 13B are simplified pictorial and close-up illustrations, respectively, of an arrangement for a bipolar transistor with a piezoresistor base fabricated on the supports of a beam;

FIGS. 13C and 13D are simplified pictorial and close-up illustrations, respectively, of an arrangement for a bipolar transistor with a piezoresistor base fabricated on the supports of a membrane;

FIG. 14 is a simplified illustration of a collector current of a bipolar transistor with a piezoresistive modulation, as a function of stress for p type and n type piezoresistor;

FIG. 15 is a simplified illustration of a sensitivity of a bipolar transistor with a piezoresistive modulation, as a function of stress for p type and n type piezoresistor;

FIGS. 16A and 16B are simplified pictorial and close-up illustrations of an arrangement for an MOS transistor fabricated on the supports of a beam;

FIGS. 16C and 16D are simplified pictorial and close-up illustrations of an arrangement for an MOS transistor fabricated on the supports of a membrane;

FIG. 17A is a simplified illustration of a drain current as a function of $V_d$ for different $V_g$ values;

FIG. 17B is a simplified illustration of a drain current as a function of $V_d$ with $V_g$=0, for different stress values;

FIG. 18 is a simplified illustration of saturation and drain currents as a function of the stress for $V_g$=0;

FIGS. 19A–19I are simplified illustrations of 9 possible configurations for fabricating the stress sensor on fixed-fixed and fixed-free beams, in accordance with nine preferred embodiments of the present invention, wherein:

FIG. 19A illustrates a pair of stress sensors on the supports of a fixed-fixed beam;

FIG. 19B illustrates one stress sensor on one support of a fixed-fixed beam;

FIG. 19C illustrates a pair of stress sensors on the supports of a fixed-fixed beam, wherein the sensors both extend onto the beam;

FIG. 19D illustrates a pair of stress sensors on the ends of a fixed-fixed beam;

FIG. 19E illustrates a pair of stress sensors on a fixed-fixed beam, positioned inwards from the ends thereof;

FIG. 19F illustrates a stress sensor on the support of a fixed-free beam;

FIG. 19G illustrates a stress sensor on the support of a fixed-free beam, wherein the sensor extends onto the beam;

FIG. 19H illustrates a stress sensor on an end of a fixed-free beam; and

Figure 20A:
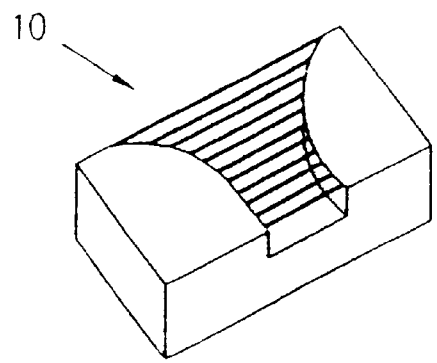
Figure 20B:
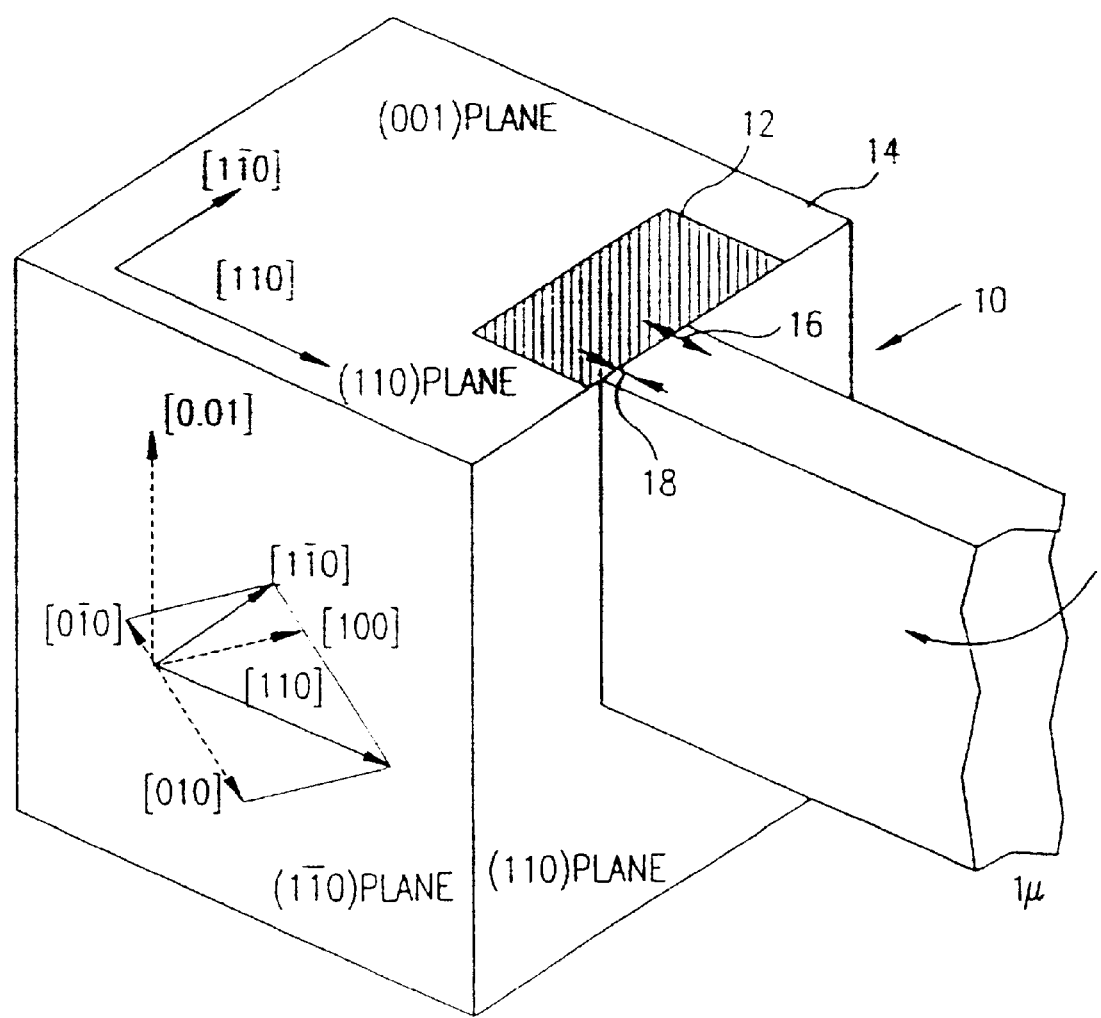
Figure 22:
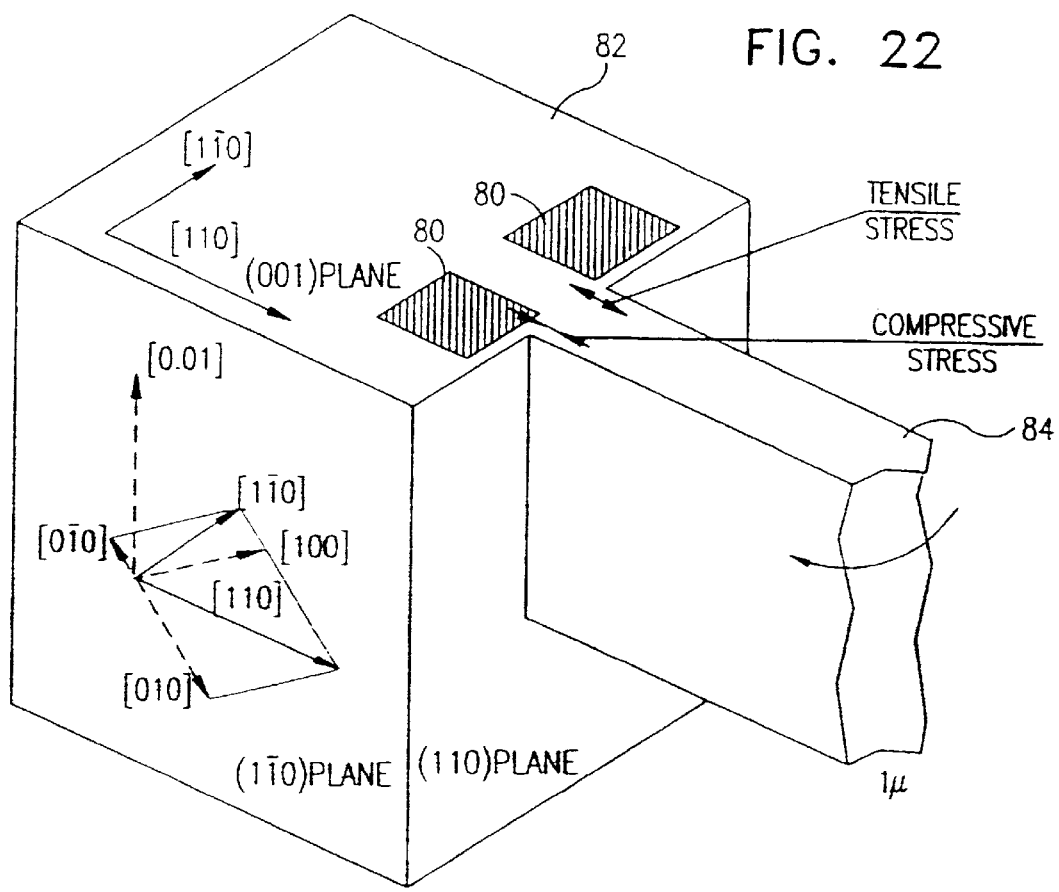
Figure 23:
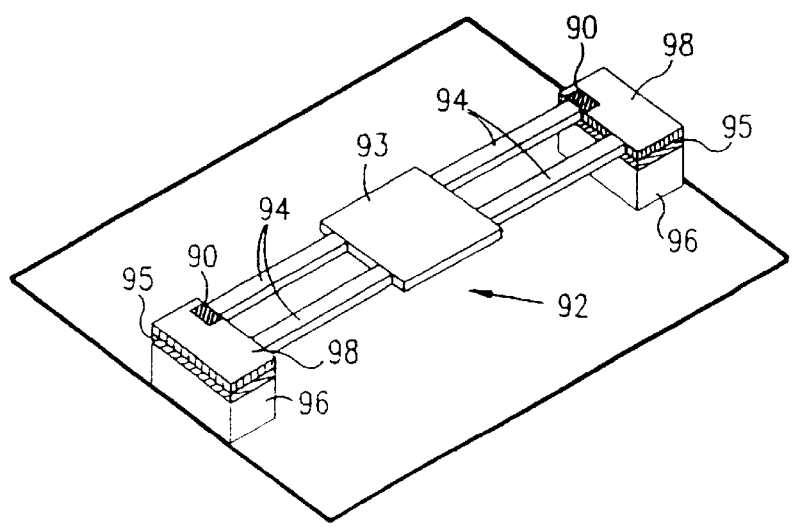

FIG. 19I illustrates a stress sensor on a fixed-free beam, positioned inwards from the end thereof, FIG. 20A is a simplified illustration of a beam array;

FIG. 20B is a simplified illustration of a sensing element on a beam support of the beam array of FIG. 20A, constructed and operative in accordance with a preferred embodiment of the present invention;

FIGS. 20C–20I are simplified illustrations of a directly integrated sensing element on a beam support of the beam array of FIG. 20A, constructed and operative in accordance with five preferred embodiments of the present invention;

FIGS. 21A are 21B are simplified illustrations of a directly integrated device, constructed and operative in accordance with a preferred embodiment of the present invention, and particularly useful for devices made of non-crystalline materials such those fabricated using surface micromachining, FIG. 21B being taken along lines B—B in FIG. 21A;

FIG. 22 is a simplified illustration of a pair of directly integrated sensors located on opposite sides of a support of a beam, constructed and operative in accordance with a preferred embodiment of the present invention; and FIG. 23 is a simplified illustration of a directly integrated sensor located on a device made of SOI (Silicon On Insulator), constructed and operative in accordance with a preferred embodiment of the present invention.

DETAILED DESCRIPTION OF PREFERRED EMBODIMENTS

In order to facilitate understanding of the present invention, first a general structure of SCS based MEMS structures is discussed.

General SCS Based Mems Structures

It is possible to fabricate SCS membranes using bulk micromachining, as discussed in E. Bassous, "Fabrication of Novel Three-Dimensional Microstructures by Anisotropic Etching of (100) and (110) Silicon", IEEE Transaction on electron devices, ED-25 (10), (1978), the disclosure of which is incorporated herein by reference. In addition it is possible to use dry and wet etching processes to pattern and release structures, as discussed in K. A. Shaw, Z. L. Zhang, N. C. MacDonald, SCREAM 1: A Single Mask, Single-Crystal Silicon, reactive ion etching process for microelectromechanical structure, Sensors and Actuators A, 40, 63–70, (1994), Y. X. Li, P. J. French, P. M. Sarro, R. F. Wolffenbuttel, "Fabrication of a single crystalline silicon capacitive lateral accelerometer using micromachining based on single stem plasma etching," MEMS '95, 398–403, (1995), and A. Benitez, J. Esteve, J. Bausells, "Bulk silicon microelectromechanical devices fabricated from commercial BESOI substrates", MEMS '95, Amsterdam, the Netherlands, 404–407, (1995), the disclosures of which are incorporated herein by reference. It is appreciated that the present invention is applicable not only to membranes, but also to plates.

SCREAM (Single Crystal Reactive Etching And Metalization) is a process that uses dry etching to pattern and release beams. Structures based on the SCREAM process are free to move in the plane of the wafer. SCS membranes on the other hand, are free to move perpendicular to the plane of the wafer. The direction of the movement of the device plays an important role as regards the sensing mechanisms used to sense the deflection, as disclosed hereinbelow. For the sake of simplicity, simple structures such as beams and membranes will be considered, these structures being regarded as part of a specific MEMS.

Figure 1:
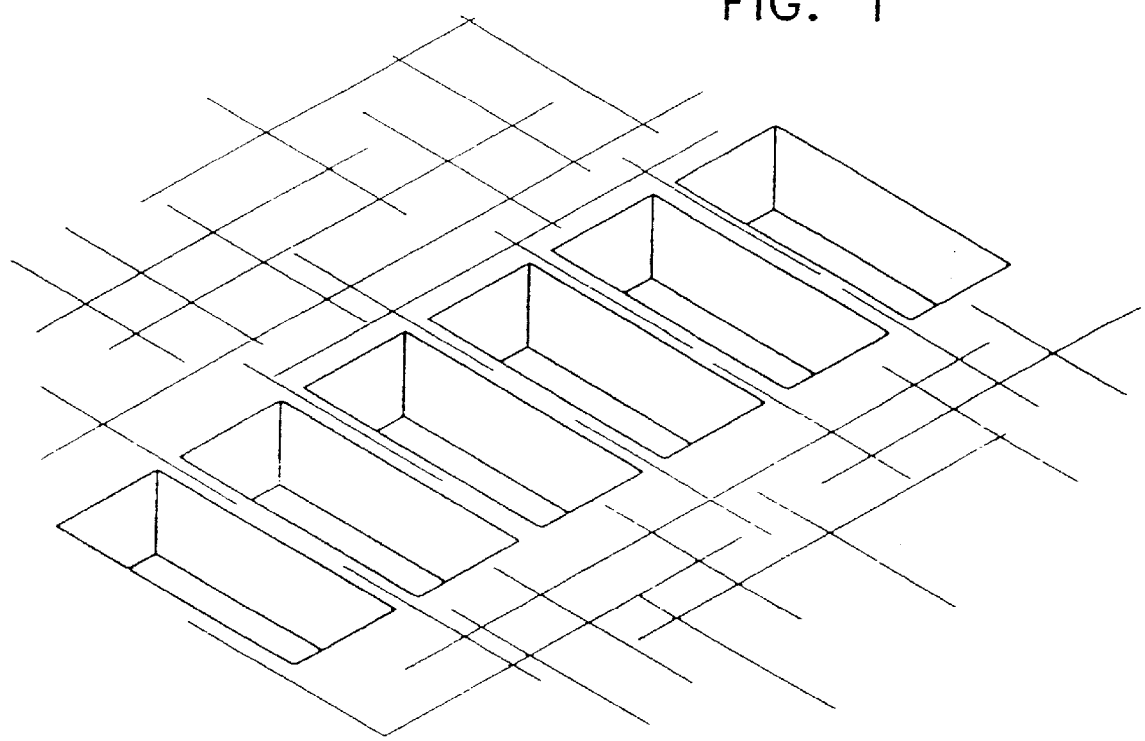
FIG. 1 is a simplified illustration of fixed-fixed beams fabricated using a SCREAM process, wherein the cross section of the beams shown is 1 $\mu$m×10 $\mu$m.

Reference is now made to FIG. 1 which shows beams made with a conventional SCREAM process that are free to move in plane. It is difficult to sense the deflection of structures moving in plane, inter alia, because it is hard to access the beam's sidewalls that stand perpendicular to the plane of the wafer. If it is possible to isolate the sidewalls and to make them conductive, as is done in the SCREAM process, it is possible to sense the deflection of the moving part by measuring the capacitance change between the moving beams and the stationary one. This measuring method is limited to configurations with a relatively large overall capacitor area and wherein the beams forming the capacitors are close to each other (<4 μm).

Figure 2:
FIG. 2 is a simplified illustration of a stress distribution along a beam under a distributed load, wherein the stress is maximum at the end of the beam and is linear with the deflection at the center of the beam, and wherein the stress at the support extends to the supports.
Figure 2:
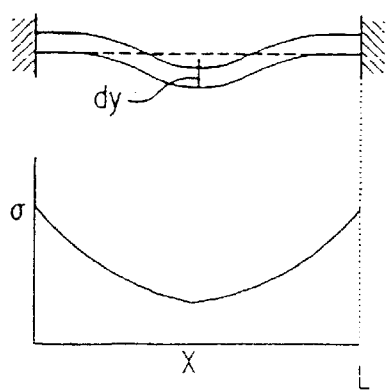

The stress distribution is an important issue to the features of the present invention, as will be discussed hereinbelow. Reference is now made to FIG. 2 which illustrates the stress distribution in the X and Y directions due to such in-plane movement of the beam. The maximum stress in the X direction is at the beam supports. Furthermore, the stress extends to the supports. The stress distribution in the Y direction is non-symmetric. Therefore, when the beam is subject to deflection in the +Y direction, the region between x=0 and x=h/2 is subject to tensile stress while the region between x=0 and x=−h/2 is subject to compressive stress.

As mentioned above, several processes can be found that result with SCS beams or membranes that are free to move out of plane. For example, I. G. Stoev, R. A. Yankov, C. Jeynes, "Formation of etch-stop structures utilizing ion-beam synthesized buried oxide and nitride layers in silicon", Sensors and Actuators, 19, 183–197, (1989), the disclosure of which is incorporated herein by reference, describes an SCS membrane that can be formed by back etching. In addition, it possible to use an epilayer to form beams or membranes, as discussed in Y. X. Li et al., op. cit.

The prior art typically senses the deflection of the membrane by measuring the capacitance change between the membrane and the substrate, or by piezoelectric or piezoresistive means.

In some respects, it is easier to sense the deflection of a structure in the out of plane configuration. This is because once the membrane is formed, it masks the substrate underneath, and thus only the upper plane of the membrane is exposed for further processing. Since the structure is free to move out of plane, this plane goes through tensile or compressive stress. Therefore, any stress depending sensing mechanism will not have the non-symmetrical effects found in the in-plane structures, as will be discussed hereinbelow. In addition, it is relatively easy to configure a system where the lower side of the membrane and the substrate are conductive, and to sense the membrane deflection by measuring the capacitance change between these two surfaces.

Sensors Location—Present Invention

In order to allow a direct integration, in accordance with a preferred embodiment of the present invention, the sensing element is positioned in such a way that the movement of the device modulates the measured quantity, i.e., changes the mechano-electric properties of the structure. With this respect it is important to note two issues regarding SCS structures.

1. The stress induced by the vibration or by the movement of a structure (that is, beam or membrane) extends to the structure supports. Since the stress can be high at the edge of the structure, the stress in the supports is significant. For example, the stress in beams is maximum at the supports and in membranes there are places on the supports where the stress is maximum.
2. In order to preserve the single crystal properties of the structure, it is preferred to leave the structure as free as possible from any additional processing such as coating or implantation.

Thus, it is possible to place the sensors on the supports where the stress is significant without affecting the SCS properties of the structure.

It is important to note that because of the stress distribution at the beam support, as discussed hereinabove with regard to in-plane degree of freedom, placing a stress sensor at the support means that the sensor will sense a combined effect of the part of the structure that is under tensile and the part that is under compressive. The non-symmetrical effect is discussed hereinbelow. Thus, for some applications it will be possible to place the sensor off axis in order to sense only the part that is under compressive stress or tensile stress.

Non-Symmetry of In-Plane Beam Vibration—Tensile and Compressive Stresses

Let $R=R(I,V)$ be the non-ohmic resistivity of a diode. If we divide the diode in half around the symmetry line, then we can assume the two halves have a resistivity of $R_1=R_2=R$, and the total resistance is $$R_0 = \frac{R}{2}.$$

When the beam vibrates, the resistivity of the two resistors change out of phase with respect to each other.

Thus, $R_1=R+\Delta R\sin(\omega t)$ and $R_2=R-\Delta R\sin(\omega t)$. If we sum the two resistors, we find:

$$\frac{1}{R_s} = \frac{1}{R + \Delta R \sin(\omega t)} + \frac{1}{R - \Delta R \sin(\omega t)} = \frac{2R}{R^2 - \Delta R^2 \sin^2(\omega t)} \quad (A1)$$

and thus, $$R_s = \frac{R}{2} - \frac{\Delta R^2}{2R} \sin^2(\omega t)$$

and $$\frac{\Delta R_0}{R_0} = -\frac{\Delta R^2}{4RR_0} + \frac{\Delta R^2}{4RR_0} \cos(2\omega t) \quad (A2)$$

Thus, a diode placed symmetrically on top of the beam will sense only secondary effects at twice ($2\omega$) the driving frequency $\omega$.

Again to further understanding of the present invention, a discussion of stress distribution in structures is now presented.

The stress in a beam due to a distributed force is shown in FIG. 2. The stress along the x direction is zero in the middle and is maximum at the beam supports. From classical mechanics we find that:

$$dq = \frac{384EI}{L^4} dy \quad (6.1.1)$$

$$I = \frac{wh^3}{12} \quad (6.1.2)$$

where q is the distributed load, E is the Young's modulus of the beam material and I is the second moment of area of the beam. W, L, and h are the width length and height of the beam respectively.

The moment, M, at the beam supports is:

$$dM = \frac{dqL^2}{12}$$

and the stress at the beam support is:

$$d\sigma = \frac{dMC}{I}$$

where $$C = \frac{h}{2}$$

From the above relations we find:

$$d\sigma = \frac{16Eh}{L^2} dy \quad (6.1.3)$$

Thus, the stress at the beam supports is proportional to the defection of the beam at the center.

By way of example, the performance of sensing mechanisms to a 100 $\mu$m long silicon beam with a cross section of 1 $\mu$m×10 $\mu$m, is calculated. It is found that:

$$d\sigma = 3.04 \times 10^{13} dy \frac{\text{dynes}}{\text{cm}^2} \quad (6.1.4)$$

where dy is in cm.

For example, for 1 $\mu$m deflection $$d\sigma = 3.04 \times 10^9 \frac{\text{dynes}}{\text{cm}^2}.$$

Stress distribution in membranes will now be discussed.

Practically, because of the wet etching process SCS membranes are rectangular. Thus, we restrict the discussion to rectangular membranes. Using classical mechanics (see X. P. Wu, M. H. Bao, W. X. Ding, "An integrated pressure transducer for biomedical applications", Sensors and Actuators, 2, 309–320, (1982)), we find that the static deflection of an unstressed rectangular membrane is:

$$du(P, x, y) = \frac{dP(1-\nu^2)}{2Eh^3}(a^2-x^2)^2 \frac{(b^2-y^2)^2}{(a^4+b^4)} \quad (6.2.1)$$

where, P is the applied pressure, $\nu$ is Poisson constant, 2a, 2b, and h are the membrane width, length, and height respectively.

Thus, the deflection at the center of the membrane is:

$$du(P, 0, 0) = \frac{dP(1-\nu^2)}{2Eh^3} a^4 \frac{b^4}{(a^4+b^4)} \quad (6.2.2)$$

The stresses in the x and y directions (see X. P. Wu et al., ibid.) are:

$$d\sigma_x(u, x, y) = -\frac{Eh}{2(1-\nu^2)}\left[\frac{\partial^2 u}{\partial x^2} + \nu \frac{\partial^2 u}{\partial y^2}\right] \quad (6.2.3)$$

$$d\sigma_y(u, x, y) = -\frac{Eh}{2(1-\nu^2)}\left[\frac{\partial^2 u}{\partial y^2} + \nu \frac{\partial^2 u}{\partial x^2}\right]$$

Thus, $$d\sigma_x(P, x, y) = \quad (6.2.4)$$
$$-\frac{dP}{h^2(a^4+b^4)}\left[(b^2-y^2)^2(3x^2-a^2) + \nu(a^2-x^2)^2(3y^2-b^2)\right]$$

$$d\sigma_y(P, x, y) =$$
$$-\frac{dP}{h^2(a^4+b^4)}\left[(a^2-x^2)^2(3y^2-b^2) + \nu(b^2-y^2)^2(3x^2-a^2)\right]$$

Figure 3:
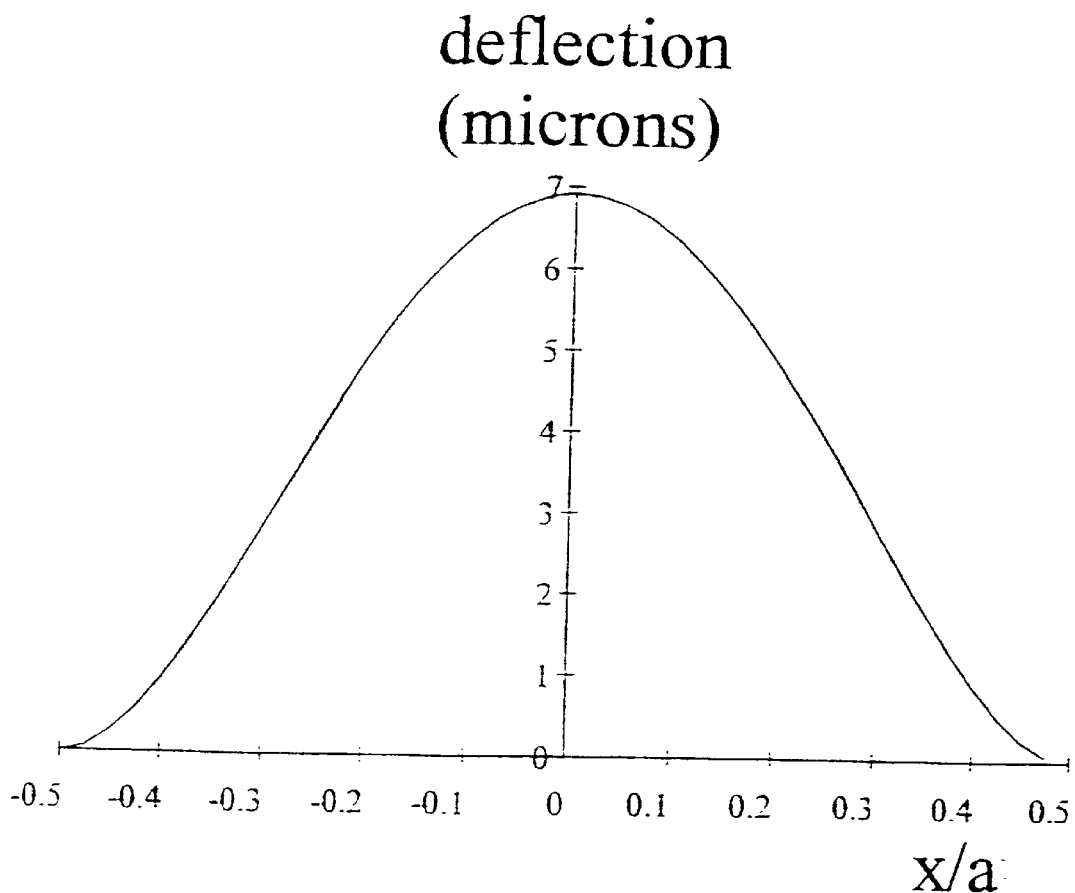
FIG. 3 is a simplified illustration of a deflection of a silicon membrane along its width with y=0, wherein the membrane dimensions are: h=15 $\mu$m, a=1000 $\mu$m, b=2000

Reference is now made to FIG. 3 which shows u(x,0) and to FIG. 4 which shows $d\sigma_x(x,0)$ and $d\sigma_y(x,0)$, respectively, of a silicon membrane subject to a static pressure P, with the following dimensions:

E=190GPa, P=$10^5$Pa, $h_m$=15 $\mu$m, a=1000 $\mu$m, b=2000 $\mu$m and, $\nu$=0.3

Thus, for y=0 and x±a, the stress is $\sigma_x$ tensile and maximum, and from Eqs. 6.2.4 and 6.2.2 we find:

$$d\sigma_x(P, \pm a, 0) = \frac{4Eh}{(1-\nu^2)a^2} du(P, 0, 0) \quad (6.2.9)$$

$$d\sigma_y(P, \pm a, 0) = \frac{4Eh\nu}{(1-\nu^2)a^2} du(P, 0, 0)$$

Thus, using the values above we find:

$$d\sigma_x(P, \pm a, 0) = 1.2 \times 10^{11} du(P, 0, 0) \frac{\text{dynes}}{\text{cm}^2}$$

where du(0,0) is in cm

For example, for du(0,0)=1 μm we find that $$d\sigma_x(\pm a, 0) = 1.2 \times 10^7 \frac{\text{dynes}}{\text{cm}^2} \quad (6.2.10)$$

Up until now, we have discussed the behavior of beams and membranes. Now a discussion of the effect of external uniaxial stress on semiconductors properties is presented.

The effect of stress on the electrical properties of semiconductors was studied in the early 1960's, by studying these effects on the performance of pn diode and bipolar transistors. These studies are found in J. J. Wortman, J. R. Hauser, R. M. Burger, "Effect of Mechanical Stress on p-n Junction Device Characteristics", J. Appl. Phys., 35(7), 2122–2131, (1964), and J. J. Wortman, J. R. Hauser, "Effect of Mechanical Stress on p-n Junction Device Characteristics, II. Generation-Recombinant Current", J. Appl. Phys., 37(9), 3527–3530, (1966), the disclosures of which are incorporated herein by reference. Here we review these effects:

The Effect of External Uniaxial Stress on the Intrinsic Carrier Concentration, ni The intrinsic concentration was found to depend on the stress through the change in the energy band structure. The stress coefficient of the band gap was found to be on the order of $10^{-12}$ eVcm$^2$/dynes (see A. Goetzberger, R. H. Finch, "Lowering the breakdown voltage of p-n junction by stress", J. Appl. Phys., 35(6), 1851–1854, (1964), the disclosure of which is incorporated herein by reference.) Thus we can write:

$$n_i^2(\sigma) = n_{i0}^2 e^{\frac{E_g 10^{-12}\sigma}{kT}} \quad (7.1.1)$$

where $n_{i0}$ is the stress free intrinsic consentration, and the stress is in dynes/cm$^2$.

The Effect of External Uniaxial Stress on the Width of a pn Junction

The width of the pn junction, $W_j$ is:

$$W_j = \sqrt{\frac{2\varepsilon_s\varepsilon_0(N_d + N_a)}{qN_dN_a}(\Phi_b + V)} \quad (7.2.1)$$

where V is the external voltage applied on the junction, and $\Phi_b$ is the built-in junction potential:

$$\Phi_b = \frac{kT}{q}\text{Ln}\left(\frac{N_aN_d}{n_i^2}\right) = \frac{kT}{q}\left(\text{Ln}\left(\frac{N_aN_d}{n_{i0}^2}\right) - \frac{E_g 10^{-12}\sigma}{kT}\right) \quad (7.2.2)$$

Thus, $W_j$ is proportional to the square-root of the stress.

The Effect of External Uniaxial Stress on the Lifetime of Injected Electrons (Holes), $\tau_{n0}(\tau_{p0})$ The lifetime of electrons and holes was found to be affected by stress through the induction of generation-recombination (G-R) centers. Experiments on Ge found that the density of dislocation is approximately linear with the applied stress (see A. R. Chaudhuri, J. R. Patel, G. Rubin, J. Appl. Phys., 35(7), 2122–2131, (1962), the disclosure of which is incorporated herein by reference.) Nevertheless, it was found (A. Goetzberger et al., op. cit.) that in the elastic range the lifetimes of electron and holes are not functions of the stress.

The Effect of External Uniaxial Stress on the Density of Carriers in the Conductance (Valence) Band, $n_1(p_1)$ The effect of the stress on the densities of charge carriers is due to the dependence of the densities of charge carriers on the intrinsic concentration:

$$n_1 = n_i e^{\frac{E_i-E_t}{kT}} = n_{10} e^{\frac{E_g 10^{-12}\sigma}{2kT}} \quad (7.4.1)$$

$$p_1 = n_i e^{\frac{E_t-E_i}{kT}} = p_{10} e^{\frac{E_g 10^{-12}\sigma}{2kT}}$$

where, $n_{10}$ and $p_{10}$ are the stress free charge carriers concentrations, and $E_t$ is the trap energy.

Thus, the density of the charge carriers depends exponentially on the stress.

The Effect of External Uniaxial Stress the Energy Level of Impurities

The effect of stress on the energy level of impurities such as arsenic, indium, aluminum, and gold was studied. See M. G. Holland, W. Paul, "Effect of pressure on the energy level of impurities in semiconductors. I arsenic, indium and aluminum in silicon", Physical Review, 128(1), 30–38, (1962) and M. I. Nathan, W, Paul, "Effect of pressure on the energy level of impurities in semiconductors. II gold in silicon", Physical Review, 128(1), 38–42, (1962), the disclosures of which are incorporated herein by reference. In these studies it was found that the stress coefficient of the ionization energy of impurities from the group V and III in silicon are in the order of $10^{-14}$ eVcm$^2$/dynes. This value is about two orders of magnitude smaller than the stress coefficient of the intrinsic energy gap, as discussed above. Thus, it is possible to neglect the effect of the stress on the energy level of traps.

The Effect of External Uniaxial Stress on the Mobility of Electrons (Holes), $\mu_n(\mu_p)$ This effect is discussed in W. P. Mason, R. N. Thurston, "Use of piezorsistive materials in the measurement of displacement, force and torque", J. Acoust. Soc. Am., 29, 1096 (1957). The stress dependence of the mobility can be found from the dependence of the piezoresistance on the stress. Reference is now made to FIG. 5, in which a beam is shown relative to the crystalographic directions of the wafer. In this case the beam is fabricated on a (001) wafer and is free to move in the plane. The beam extends along the [110] direction, and the sensing element is placed in such a way that the current flows in the [110] direction. In that case we find that:

$$\frac{d\rho}{\rho} = \sigma\frac{1}{2}[\pi_{11} + \pi_{12} + \pi_{44}] = \sigma\pi_{\text{eff}} \quad (7.6.1)$$

The relation between the resistivity and the mobility is:

$$\frac{1}{\rho} = qC\mu \quad (7.6.2)$$

where, q is the elementary charge and C is the charge carrier concentration. Thus we find that:

$$\frac{d\rho}{\rho} = -\frac{d\mu}{\mu} \tag{7.6.3}$$

Table 1 shows the piezoresistivity constant for n type and p type silicon

TABLE 1

| Silicon type | $\rho$<br>$\Omega$ cm | $\pi_{11}$<br>$10^{-12}$ cm²/dyne | $\pi_{12}$<br>$10^{-12}$ cm²/dyne | $\pi_{44}$<br>$10^{-12}$ cm²/dyne |
|---|---|---|---|---|
| n | 11.2 | −102.2 | 53.4 | −13.6 |
| p | 7.8 | 6.6 | −1.1 | 138.1 |

Thus, for n type silicon, $$\frac{d\mu}{\mu} = 3.52 \times 10^{-11} \sigma$$

and for p type silicon, $$\frac{d\mu}{\mu} = -14.36 \times 10^{-11} \sigma$$

where $\sigma$ is in dynes/cm².

These equations can be written in the following way:

$$\mu(\sigma) = \mu_0(1 + 3.52 \times 10^{-11}\sigma) \text{ for n type} \tag{7.6.4a}$$

$$\mu(\sigma) = \mu_0(1 - 14.36 \times 10^{-11}\sigma) \text{ for p type} \tag{7.6.4b}$$

The piezoresistive effect for p type in the (110) direction is about three times higher than that for n type.

Table 2 summarizes the dependence of the material properties on the stress. We find that the intrinsic and charge carrier concentrations are exponentially depended on the stress, the mobility is linear with the stress, and the pn junction width is proportional to the square-root of the stress. In the following theoretical discussions we find that when the performance of a device depends on the intrinsic concentration it is sufficient to consider only this affect and to ignore the affect on the other properties. This assumption was supported by experimental results (see J. J. Wortman, J. R. Hauser, R. M. Burger, op. cit.).

In addition, we find that the stress effect depends on the crystal orientation relative to the stress vector. The mobility was found to have directional dependence because of its relation to the piezoresistive effect of the matieral. The intrinsic concentration was found have small directional dependence in silicon and a somewhat higher in germanium (see J. J. Wortman, J. R. Hauser, R. M. Burger, ibid.).

TABLE 2

| PROPERTY | STRESS FUNCTION |
|---|---|
| Intrinsic carrier concentration, $n_i$ | $n_i^2(\sigma) = n_{i0}^2 e^{\frac{E_g 10^{-12}\sigma}{kT}}$ |
| pn junction width | $W_j(\sigma) = \sqrt{\frac{2\varepsilon_s\varepsilon_0(N_d + N_a)}{qN_dN_a}(\Phi_b + V)}$<br>where |

TABLE 2-continued

| PROPERTY | STRESS FUNCTION |
|---|---|
| | $\Phi_b(\sigma) = \frac{kT}{q}\left(\text{Ln}\left(\frac{N_aN_d}{n_{i0}^2}\right) - \frac{E_g 10^{-12}\sigma}{kT}\right)$ |
| Density of carriers | $n_1(\sigma) = n_{10}e^{\frac{E_g 10^{-12}\sigma}{2kT}}$<br>$p_i(\sigma) = n_{10}e^{\frac{E_g 10^{-12}\sigma}{2kT}}$ |
| Mobility<br>The stress is applied in the<br>[110] direction and the<br>current flows in the [110] | $\mu(\sigma) = \mu_0(1 + 3.52 \times 10^{-11}\sigma)$ n type<br>$\mu(\sigma) = \mu_0(1 - 14.36 \times 10^{-11}\sigma)$ p type<br>$\sigma$ is in dynes/cm². |

After having discussed the behavior of beams and membranes, and the effect of external uniaxial stress on semiconductors properties, sensors constructed and operative in accordance with preferred embodiments of the present invention are now disclosed.

Modeling Integrated Sensing Mechanisms in Accordance with a Preferred Embodiment of the Present Invention Schottky Diode Reference is now made to FIGS. 6A and 6B which show a beam with a Schottky diode placed at the beam supports. Reference is further made to FIGS. 6D and 6E which show a membrane with a Schottky diode placed at stressed areas around the membrane frame. FIG. 6C illustrates a sectional view of the Schottkey diode of FIGS. 6A, 6B, 6D and 6E. Since the stress distribution around the frame is not constant, it is possible to optimize the sensitivity of the device by confining the diode area and location. The Schottky diode is created at the junction of a metal and the SCS supports. Because the stress is not symmetric in the Y direction half of the beam will be subject to compressive stress and half will be subject to tensile stress. It has shown that for Schottky diode formed between metal and polycrystalline diamond, the compressive stress has a large affect on the forward bias characteristics (see G. Zhao, E. M. Charlson, T. Stacy, J. M. Meese, "Effect of mechanical stress on current-voltage characteristics of thin film polycrystalline diamond Schottky diode", J. Appl. Phys. 73(4), 1832–1837, (1993), the disclosure of which is incorporated herein by reference). In the reverse bias, on the other hand, this effect was found to be relatively small. The response of the diode to compressive stress was found to be linear for low forward bias and exponential for large forward bias. As described above, compressive stress has an opposite affect to a tensile stress. Thus, placing the diode symmetrically on a beam support is equivalent to two diodes connected in parallel where one diode is subject to a compressive stress and the other is subject to tensile stress. The parallel connection between the two diodes reduces the overall effect, as described hereinabove in the paragraph about non-symmetric behavior of in-plane beam movement. Thus, in order to increase the response of the device, the diode is preferably fabricated off axis as shown in FIG. 6A.

PN Junction Diode

Reference is now made to FIGS. 7A and 7B which show a beam with a pn junction diode placed at the beam supports. Reference is further made to FIGS. 7C and 7D which show a membrane with junction diode placed on the frame in two orientations. The effect of external stress on the pn diode performance is related to the Schottky current through the band structure and to the generation-recombination current.

In J. J. Wortman, J. R. Hauser, R. M. Burger, op. cit., it was found that for pn junction the stress dependent Schottky current is:

$$I_s = I_{s0}\left(\frac{A_T - A_s}{A_T} + \frac{A_s}{A_T}e^{\frac{E_g 10^{-12}\sigma}{kT}}\right) \quad (8.2.1)$$

$$I_{s0} = I_{p0} + I_{n0}$$

where, $A_\tau$ is the diode cross section, $A_s$ is the area on the diode cross section that is under stress. $I_{p0}$ and $I_{n0}$ are the unstressed hole and electron currents respectively:

$$I_{p0} = \frac{qA_T D_p P_{n0}}{L_p}\coth\left(\frac{W_n}{L_p}\right) \quad (8.2.2)$$

$$I_{n0} = \frac{qA_T D_n n_{p0}}{L_n}\coth\left(\frac{W_p}{L_n}\right)$$

$W_n$ and $W_p$ are the width of the n and p region respectively.

If we assume that the diode cross section is uniformly stressed then Eq. 8.2.1 is reduced to:

$$I_s = I_{s0}e^{\frac{qV + E_g 10^{-12}\sigma}{kT}} \quad (8.2.3)$$

where $I_{s0}$ is the unstressed saturation current.

For reverse bias where qv<<kT we find that the saturation current is $$I_{ss} = I_{s0}e^{\frac{E_g 10^{-12}\sigma}{kT}} \quad (8.2.4)$$

Thus, the saturation current depends exponentially on the stress.

In J. J. Wortman, J. R. Hauser, op. cit., the effect of stress on the generation-recombination current was studied. The stress dependent generation-recombination (G-R) current was approximated to be (see J. Hauser, "An approximation for generation-recombinant current in p-n junction", Proc. IEEE, 53, 743–744, (1965), the disclosure of which is incorporated herein by reference):

$$I_r = \frac{qn_i^2 W_j A_T\left(e^{\frac{qV}{kT}} - 1\right)}{(\tau_{p0}n_1 + \tau_{n0}p_1) + (\tau_{p0} + \tau_{n0})n_i e^{\frac{qV}{2kT}}} \quad (8.2.5)$$

For forward current where $$\frac{qV}{2kT} \gg \frac{\text{Ln}(\tau_{p0}n_1 + \tau_{n0}p_1)}{n_i(\tau_{p0} + \tau_{n0})} \quad (8.2.6)$$

Eq. 8.2.5 reduces to:

$$I_r = \frac{qn_i W_j A_T e^{\frac{qV}{2kT}}}{\tau_{p0} + \tau_{n0}} \quad (8.2.7)$$

Using Eq. 7.1.1 we find that:

$$I_r = I_{rf0}e^{\frac{qV + E_g 10^{-12}\sigma}{2kT}} \quad (8.2.8)$$

where $$I_{rf0} = \frac{qn_{i0} W A_T}{\tau_{p0} + \tau_{n0}} \quad (8.2.9)$$

In reverse bias where:

$$I_r = \frac{qV}{kT} \ll 1$$

Eq. 8.2.5 reduces to $$I_{rs} = \frac{qn_i W_j A_T}{\tau_{p0}e^{\frac{E_i - E_t}{kT}} + \tau_{n0}e^{-\frac{E_i - E_t}{kT}}} = I_{rr0}e^{\frac{E_g 10^{-12}\sigma}{2kT}} \quad (8.2.10)$$

where $$I_{rr0} = \frac{qn_{i0} W_j A_T}{\tau_{p0}e^{\frac{E_i - E_t}{kT}} + \tau_{n0}e^{-\frac{E_i - E_t}{kT}}} \quad (8.2.11)$$

Combining the Schottky and the G-R currents we find:

$$I_T = I_{s0}e^{\frac{qV + E_g 10^{-12}\sigma}{kT}} + I_{rf0}e^{\frac{qV + E_g 10^{-12}\sigma}{2kT}} \quad (8.2.12)$$

for $\dfrac{qV}{2kT} \gg \dfrac{\text{Ln}(\tau_{p0}n_1 + \tau_{n0}p_1)}{n_i(\tau_{p0} + \tau_{n0})}$ and the saturation current is $$I_{r0} = I_{s0}e^{\frac{E_g 10^{-12}\sigma}{kT}} + I_{rr0}e^{\frac{E_g 10^{-12}\sigma}{2kT}} \quad (8.2.13)$$

for $qV \ll kT$

For large forward bias the Schottky current dominates the stress dependent I-V characteristics. In addition, we find that the saturation current is stress dependent.

Reference is now made to FIG. 8A which illustrates the I-V characteristic of a junction diode for $$\frac{qV}{2kT} \gg \text{Ln}\frac{(\tau_{p0}n_1 + \tau_{n0}p_1)}{n_i(\tau_{p0} + \tau_{n0})}.$$

Reference is further made to FIG. 8B which illustrates I-V characteristic of a junction diode for qV<<kT for different stress values. Reference is further made to FIG. 9 which illustrates the diode current as a function of the stress for V=0.7V.

Bipolar Transistor

Reference is now made to FIG. 10A which shows a beam with a bipolar transistor placed at the beam supports. Reference is further made to FIGS. 10B and 10C which show a membrane with a bipolar transistor placed around the membrane frame. Once again, it is noted that the stress distribution around the frame is not constant, and that it is possible to optimize the sensitivity of the device by confining the bipolar transistor area and location.

A stress was applied to a pnp transistor in different configurations (J. J. Wortman, J. R. Hauser, op. cit.). When the stress is applied on both sides of the emmiter-base junction, the collector current was found to be:

$$I_c(\sigma) = (1-\theta)I_{p0}e^{\frac{qV_{eb}}{kT}}\left(A_b + B_b e^{\frac{E_g 10^{-12}\sigma}{kT}}\right) \quad (8.3.1)$$

where σ is the recombination current constant, and $I_{p0}$ is the unstressed hole current.

$$A_b = \frac{A_T - A_{sn}}{A_T} \quad (8.3.2)$$

$$B_b = \frac{A_{sp}}{A_T}$$

where $A_\tau$ is the cross section area of the transistor, $A_{sn}$ and $A_{sp}$ are the stressed areas at the edges of the depletion region on the n and p sides of the transistor emitter-base junction, respectively. In our case we assume that these areas equal to the cross section of the transistor, and therefore $A_b$=0 and $B_b$=1. Thus, Eq. 8.3.1 is reduced to:

$$I_c(\sigma) = (1-\theta)I_{p0}e^{\frac{qV_{eb}+E_g 10^{-12}\sigma}{kT}} \quad (8.3.3)$$

From Eq. 8.3.3 it is clear that the applied stress shifts the unstressed I-V curve. FIG. 11 illustrates the $I_c$-$V_{eb}$ curve for different stress levels. FIG. 12 illustrates the current as a function of the applied stress for $V_{eb}$=0.5V.

Bipolar Transistor with Base Current Modulation

Reference is now made to FIGS. 13A and 13B which show a beam with a bipolar transistor where a piezoresistor (preferably doped silicon) connected to the base of the transistor is placed at the beam supports. Reference is further made to FIGS. 13C and 13D which show a similar configuration for a membrane. Here the stress modulates the piezoresistor resistivity and thus modulates the base current. This modulation is amplified at the drain current by a factor of 60–100.

With the configuration shown in FIG. 5 we find that:

$$\frac{d\rho}{\rho} = \sigma\frac{1}{2}[\pi_{11} + \pi_{12} + \pi_{44}]$$

or, $$\rho(\sigma)=\rho_0(1+\pi_{eff}\sigma) \quad (8.4.1)$$

From table 1 we find that for n type silicon $$\rho(\sigma)=\rho_0(1+3.12\times10^{-11}\rho)$$

and for p type silicon $$\rho(\sigma)=\rho_0(1-7.18\times10^{-11}\rho)$$

where σ is in dynes/cm².

The resistivity of the piezoresistor is:

$$R(\sigma) = \rho\frac{L}{A} = \frac{\rho_0 L}{A}(1+\pi_{eff}\sigma) \quad (8.4.2)$$

If we assume the piezoresistor length is 5 μm and its cross section is 0.5 μm×2 μm, then for n type silicon $$R(\sigma)=5.85\times10^5(1+3.12\times10^{-11}\sigma)$$

with $\rho_0$=0.117 Ω m, and for p type silicon $$R(\sigma)=3.9\times10^5(1-7.18\times10^{-11}\sigma)$$

with $\rho_0$=0.078 Ω m.

The collector current is $$I_c=\beta I_b$$

Thus, we find:

$$I_c = \frac{\beta V}{R(\sigma)} = \frac{\beta V A}{\rho_0 L(1+\pi_{eff}\sigma)} \quad (8.4.3)$$

Reference is now made to FIG. 14, which illustrates Ic as a function of the stress, and to FIG. 15 which illustrates the sensitivity as a function of the stress with β=100, V=0.5V, for p type and n type base piezoresistor. It is noted that the current of the bipolar transistor with the p type base piezoresistor increases with stress, while the bipolar transistor with the n type base piezoresistor decrease with stress. In addition the slope of the Ic curve of the p type piezoresistor is larger than that of the n type piezoresistor. This means that with p type base piezoresistor the sensitivity will be higher.

Mosfet Transistors

Reference is now made to FIGS. 16A and 16B which show a beam with an MOS transistor placed at the beam supports. Reference is further made to FIGS. 16C and 16D which show the same configuration for a membrane. The drain-source current in an n channel MOS transistor for $V_d$<$V_{sat}$ is:

$$I_d = \frac{Wd}{L}N_D q\mu_n\left\{V_D - \frac{2}{3d}\sqrt{\frac{8\varepsilon_s\varepsilon_0}{qN_D}}\left[(V_D + \Phi_B - V_G)^{\frac{3}{2}} - (\Phi_B - V_G)^{\frac{3}{2}}\right]\right\} \quad (8.5.1)$$

The properties that are affected by applying external stress are, the built in voltage on the pn junction $\Phi_B$, and the mobility $\mu_n$. The maximum channel thickness, d, the length of the channel, L, and the width of the channel W, are affected by the stress through the piezoresistance change due to dimensional changes. These effects are ignored here. As discussed above:

$$\mu(\sigma)=\mu_0(1+10^{-10}\sigma)$$

and $$\Phi_b(\sigma) = \frac{kT}{q}\left(\text{Ln}\left(\frac{N_a N_d}{n_{i0}^2}\right) - \frac{E_g 10^{-12}\sigma}{kT}\right)$$

where σ is in dynes/cm².

Reference is now made to FIG. 17A which illustrates $I_d$ current as a function of $V_d$ for different $V_g$ assuming no stress is applied. Reference is further made to FIG. 17B which illustrates $I_d$ as a function of $V_d$ for $V_g$=0 for different stress values. Reference is further made to FIG. 18 which illustrates $I_d$ as a function of the stress for $V_g$=0 $V_d$=1V and $I_{sat}$ as a function of the stress for $V_g$=0 $V_d$=1V.

These curves were evaluated using the following parameters:

$$\epsilon_0 = 8.86 \times 10^{-14} F/cm$$

$$\epsilon_s = 11.7$$

$$N_d = 2.5 \times 10^{15} cm^{-3}$$

$$N_a = 2.5 \times 10^{15} cm^{-3}$$

$$\mu_e = 1350 cm^2/Vsec$$

$$k = 1.38 \times 10^{-23} J/K$$

$$T = 300K$$

$$d = 3 \times 10^{-4} cm$$

$$W = 2 \times 10^{-4} cm$$

$$L = W/170$$

Reference is now made to FIGS. 19A–19I are simplified illustrations of 9 possible configurations for fabricating the stress sensor on fixed-fixed and fixed-free beams, in accordance with nine preferred embodiments of the present invention, wherein:

FIG. 19A illustrates a pair of stress sensors on the supports of a fixed-fixed beam;

FIG. 19B illustrates one stress sensor on one support of a fixed-fixed beam;

FIG. 19C illustrates a pair of stress sensors on the supports of a fixed-fixed beam, wherein the sensors both extend onto the beam;

FIG. 19D illustrates a pair of stress sensors on the ends of a fixed-fixed beam;

FIG. 19E illustrates a pair of stress sensors on a fixed-fixed beam, positioned inwards from the ends thereof;

FIG. 19F illustrates a stress sensor on the support of a fixed-free beam;

FIG. 19G illustrates a stress sensor on the support of a fixed-free beam, wherein the sensor extends onto the beam;

FIG. 19H illustrates a stress sensor on an end of a fixed-free beam; and

FIG. 19I illustrates a stress sensor on a fixed-free beam, positioned inwards from the end thereof.

Fabricating the sensor on both sides of the fixed-fixed beam doubles the measured signal.

Reference is now made to FIG. 20A which illustrates a beam array 10. In general, the beams of beam array 10 have different function and orientation. Beam array 10 is an example of a device called a "Frequency Signature Sensor" and described in D. Haronian, N. C. MacDonald, "A microelectromechanics based frequency signature sensor", Sensors and Actuators, A, 53, 1–4, 288–298, (1996), the disclosure of which is incorporated herein by reference.

Reference is now made to FIG. 20B which illustrates a sensing element 12 that is fabricated on each beam support 14 of beam array 10. As shown in FIGS. 19A–19I, the sensing element can be placed on the support or on the beam close to the support. As a result of deflection or vibrations of the beam, the region of the beam close to the support is stressed. If the beam is deflected in one direction, one half of the beam is in tensile stress, designated by reference numeral 16, and the other is in compressive stress, designated by reference numeral 18. When the beam is deflected to the other direction, the stress on the two halves of the beam is inverted. Because of this effect, it may be more efficient to place the sensing element off-axis as shown in the FIG. 20B.

Figure 20C:
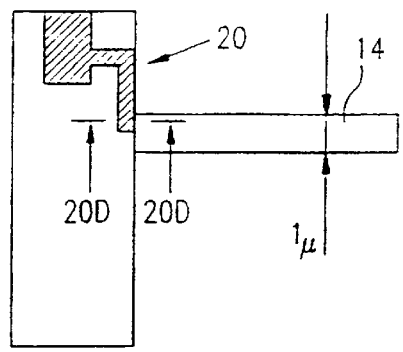
Figure 20D:
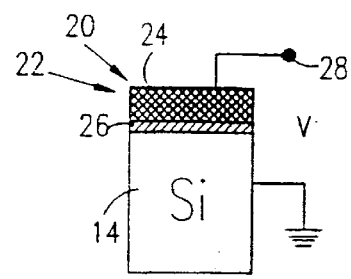

Reference is now made to FIGS. 20C and 20D which illustrate a sensing element 20. Sensing element 20 is preferably a Schottky diode 22 used to sense vibrations of one of the beams. The Schottky diode 22 is preferably made of a metal portion 24 placed on the support 14. This results in a Schottky junction 26 formed at the metal-semiconductor interface which is responsible for the function of the diode. The junction 26 is preferably biased by an external voltage 28, and the stress, induced by the vibrations, modulates the current passing through the diode.

Figure 20E:
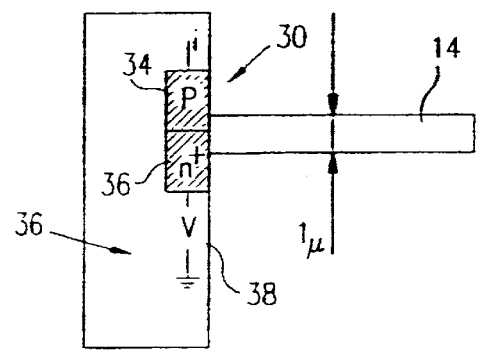

Reference is now made to FIG. 20E which illustrates a sensing element 30. Sensing element 30 is preferably a pn diode 32 used to sense the stress. In this embodiment, diode 32 is preferably made of a 'p' type silicon 34 and an 'n+' type silicon 36 where the junction between these regions is placed off-axis in order to increase the sensitivity of the device. The junction is preferably biased by an external voltage 38, and the stress, induced by the beam displacement, modulates the current passing through the diode.

Figure 20G:
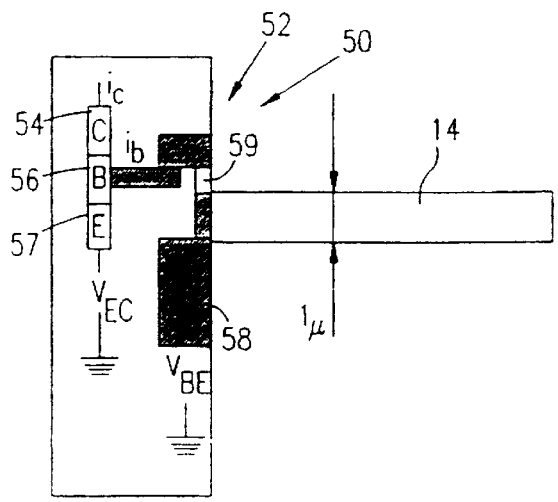
Figure 20F:
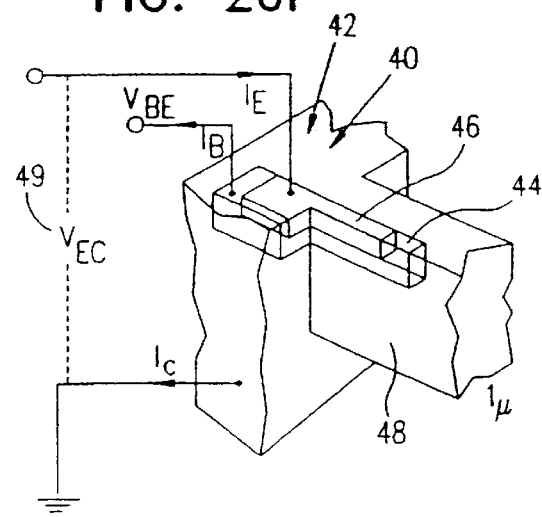

Reference is now made to FIG. 20F which illustrates a sensing element 40. Sensing element 40 is preferably a bipolar transistor 42 fabricated off-axis on the support 14, and extends to the beam itself Bipolar transistor 42 is preferably made of an 'n+' type silicon 44 serving as the base, a 'p++' type silicon 46 serving as the emitter, and a 'p+' type silicon 48 serving as the collector. The transistor is preferably biased by an external voltage 49, and the stress, induced by the beam displacement, modulates the current passing through it. Alternatively, the emitter, i.e., silicon 46 may be omitted, thereby forming a pn diode comprising the 'n+' type silicon 44 and the 'p+' type silicon 48.

Reference is now made to FIG. 20G which illustrates a sensing element 50. Sensing element 50 is preferably a bipolar transistor 52 having a collector 54, a base 56, and an emitter 57. Base 56 of transistor 52 is preferably connected by conductors 58 to a piezoresistor 59 fabricated off-axis on the beam support 14. The stress, induced by the beam displacement, modulates the resistivity of the piezoresistor which modulates the base current. This modulation affects the voltage '$V_{BC}$' and the current '$i_c$', which are used to sense the displacement of the beam.

Reference is now made to FIGS. 20H and 20I which illustrate a sensing element 60. Sensing element 60 is preferably an MOS sensing element. A tunnel 62 extends from a source 64 to a drain 66. The stress, induced by the displacement of the beam, modulates the drain current for a given gate 67 voltage. This current is used to sense the deflection of the beam.

In FIGS. 20C–20I, the sensing elements are fabricated on the beam. Because of the non-symmetric behavior of in-plane movement of the beam discussed hereinabove, it has been noted in the above description that the sensing elements may be fabricated off-axis. It was assumed that the energy is stored in bending the beam as known from classical mechanics. It is important to note that an element with a given rigidity, under axial stress can store some of the energy in stretching rather in bending. In this case the behavior of the element is a combination of a string and a beam. In an extreme case, such an element, although having rigidity, stores most of the energy in stretching rather than in bending. Since the stretching is applied uniformly on the cross section of the element, it is not necessary to fabricate the sensing element off-axis.

Reference is now made to FIGS. 21A and 21B which illustrate a directly integrated sensing element 70 (seen in FIG. 21B), constructed and operative in accordance with a preferred embodiment of the present invention, and particularly useful for devices made of non-crystalline materials such those fabricated using surface micromachining.

A membrane 72 is supported by beams 74 fabricated on a silicon substrate 76. Membrane 72 and beams 74 can be made of any material, for example, T. W. See D. Haronian, N. C. MacDonald, "Spring suspended corrugated membrane", J. Micromechanics and Microengineering, 5, 289–296, (1995) and A. T. T. D. Tran, Y. H. Lo, Z. H. Zhu, D. Haronian, E. Mozdy "Surface micromachined Fabry-Perot tunable filter," IEEE J. Photonics Technology Letters, 8 (3), (1996), the disclosures of which are incorporated herein by reference. Beams 74 are preferably isolated from substrate 76 by means of an insulating material 78. When membrane 72 is deflected up or down or to the sides, the stress on beams 74 is translated to stress on the supports of beams 74. This stress is transferred to silicon substrate 76 underneath, which modulates the performance of directly integrated sensing element 70 fabricated in the silicon support. The modulation of sensing element 70 is used to sense the deflection of membrane 72.

Reference is now made to FIG. 22 which illustrates a pair of directly integrated sensors 80 located on opposite sides of a support 82 of a beam 84, constructed and operative in accordance with a preferred embodiment of the present invention. When beam 84 is bent, one half thereof is in tensile stress and the other half is in compressive stress. When beam 84 is bent in an opposite direction, the stresses on the two halves of the beam are switched. In the configuration of FIG. 22, additional information can be gained by summing and subtracting the output from the two sensors 80. For example, it is possible to indicate whether beam 84 bends up or down, rather than to the sides. This is indicated when the difference of the signals is zero but the sum is non-zero.

Reference is now made to FIG. 23 which illustrates a directly integrated sensor 90 located on a device 92 made of SOI (Silicon On Insulator), constructed and operative in accordance with a preferred embodiment of the present invention. A silicon membrane 93 is supported by silicon beams 94 fabricated on an insulator 95, usually made of SiO$_2$. These two layers are fabricated on a silicon substrate 96. Sensor 90 is preferably fabricated on a silicon support 98.

Advantage Over Prior Art

The prior art methods of sensing the deflection of vibrating element in MEMS are based on capacitance, piezoresistance, piezoelectric effect and optics. Hereinbelow, a comparison of the direct integration of microelectronics devices with MEMS, in accordance with the teachings of the present invention, with the prior art is presented.

Prior Art

Capacitance

In order to capacitively sense the displacement of the vibrating element, it is necessary to place the element close to a rigid wall, and the capacitance between the displaced element and the rigid wall is measured. For that purpose the wall and the area facing it should be conductive and wired to a power source. As the overall dimensions of MEMS become smaller, the sensitivity and resolution of sensors based on capacitance measurement become smaller as well. In order to overcome this problem the gap between the element and the rigid wall should be smaller as well. This in turn leads to problems such as sticking between the vibrating element and the rigid wall, and squeeze film damping in systems that do not operate in vacuum.

Piezoresistance

Piezoresistance is related to change in the resistance of a piece of material due to the change in the geometry of the piece or to the change in the resistivity of the material induced by stress. For most practical uses, we can ignore the geometry based piezoresistance and focus on the changes in the resistivity of the material. Piezoresistors sensors are placed at locations in the MEMS where the stress is maximum. In microelectronics, piezoresistors are fabricated by doping specific areas with n or p type materials. In that respect it is important to note that microelectronic elements such as diodes and transistors are also formed by doping different areas in the silicon bulk. However, unlike the directly integrated sensors of the present invention, piezoresistors do not have built in gain, and are thus inefficient in translating a mechanical effect into an electrical effect.

Piezoelectric Effect

The piezoelectric effect is the generation of electric polarization in certain dielectric crystals as a result of the application of mechanical stress. Piezoelectric materials can be integrated in MEMS. By coating beams for example with piezoelectric material it is possible to convert the stress in the deformed beam to an electrical signal at the two poles of the piezoelectric material. Nevertheless, the integration of such materials with conventional MEMS is difficult, inter alia because of the large internal stress of the piezoelectric material.

Optics

Optical sensing is typically very sensitive and can be translated into high spatial resolution. Nevertheless, conventional optical sensors, such as position sensitive detectors (PSD) or those based on Doppler shift, are non-monolithic, and thus their integration is expensive and inefficient, especially when it comes to mass-production. In addition, if the MEMS comprises many vibrating elements, it is not practical to integrate conventional optical sensors, simply because of the complexity of the system.

Present Invention

Direct Integration of Sensors

The direct integration of sensors described in this invention, does not require additional mechanical parts to be fabricated close to the vibrating element. Therefore, these sensors do not interfere with the interaction of the device with the physical field, as found in capacitance based sensors. In addition, the absence of any need for a fixed structure close to the moving part simplifies the fabrication process. For example, there is no need for special means to prevent sticking between the moving and fixed structures, something which is very common in displacement sensing.

Devices with high output impedance cannot be directly integrated with microelectronics systems. These devices are usually fed into a preamplifier in order to reduce their output impedance before they are further amplified. In all of the above sensors except for the direct integration sensor, the current is small and the output impedance is relatively high. Since the direct integration sensors have low output impedance, they do not need to be matched with other microelectronics devices. In addition, direct integration sensors have a built-in gain and thus, the output signal is high. It is possible to integrate the device with on-chip electronics without additional impedance matching.

The direct integration described in this invention allows a full separation between the fabrications of the sensing elements and the fabrication of the mechanical structure. Thus, it is possible to use conventional fabrication methods and apparatus to fabricate low-cost wafers with the sensing elements, and to complete the mechanical part of the device separately.

The table below summarizes the advantages of the direct sensing over conventional sensing.

|  | Squeeze film damping, and sticking problem | Mass production | Monolithic process | Built-in gain | Separation between electric part and mechanical part fabrication |
| --- | --- | --- | --- | --- | --- |
| capacitance | YES | YES | YES | NO | NO |
| piezoresistive | NO | YES | YES | NO | NO |
| piezoelectric | NO | YES | YES | NO | NO |
| optics | NO | NO | NO | NO | YES |
| direct integration | NO | YES | YES | YES | YES |

Another advantage of the direct integration of sensors of the present invention is their potentially high resolution. The noise sources in MEMS can be divided into three parts: mechanical noise, sensor noise, and processor noise. The mechanical noise is due to thermal agitation and is common to all MEMS. The mechanical noise is a function of the device material and geometry. The sensor noise is related to the sensing mechanism, i.e., photon shot noise, laser flicker noise, thermal noise, etc. The processor noise is related to the processor where the electrical signals are processed. Since the direct integration sensors of the present invention are based on elements that the processor itself is based on, they have a noise floor that is smaller than all other sensing methods. Therefore, the direct integration sensors of the present invention have the potential of having high resolution.

What is claimed is:

1. A microelectronics deformation sensor comprising:
   at least one stress sensor directly integrated on an extremity of a support of a deformable structure, said deformable structure being constructed of a single crystal material and having a reference plane, said deformable structure deforming in-plane relative to said reference plane, said at least one stress sensor sensing a stress in a vicinity of said extremity of said support and thereby quantitatively detecting a deformation of said deformable structure.

2. A deformation sensor according to claim 1 wherein said at least one stress sensor is located substantially symmetrically about a symmetry axis of said deformable structure.

3. A deformation sensor according to claim 1 wherein said at least one stress sensor is located asymmetrically with respect to a symmetry axis of said deformable structure.

4. A deformation sensor according to claim 1 wherein said at least one stress sensor is evaporated on at least one of said deformable structure and said support of said deformable structure.

5. A deformation sensor according to claim 1 wherein said at least one stress sensor is grown on said support of said deformable structure.

6. A microelectronics deformation sensor comprising:
   at least one stress sensor directly integrated on an extremity of a support of a deformable structure said deformable structure being constructed of a polysilicon and having a reference plane, said deformable structure deforming in-plane relative to said reference plane, said at least one stress sensor sensing a stress in a vicinity of said extremity of said support and thereby quantitatively detecting a de formation of said deformable structure.

7. A deformation sensor according to claim 1 wherein said deformable structure comprises at least one fixed-fixed beam.

8. A deformation sensor according to claim 1 wherein said deformable structure comprises fixed-fixed beams of substantially equal lengths.

9. A deformation sensor according to claim 1 wherein said deformable structure comprises fixed-fixed beams of different lengths.

10. A deformation sensor according to claim 7 wherein said at least one beam is under axial tensile stress.

11. A deformation sensor according to claim 7 wherein said at least one beam has a mechanical behavior of a string.

12. A deformation sensor according to claim 7 wherein said at least one beam has a mechanical behavior of a string-beam system.

13. A deformation sensor according to claim 7 wherein said at least one beam is under axial compressive stress.

14. A method for sensing deformation of a microelectromechanic systems (MEMS), comprising the steps of:
   directly integrating at least one stress sensor on an extremity of a support of a deformable structure of said MEMS, said deformable structure being constructed of a single crystal material and having a reference plane, said deformable structure deforming in-plane relative to said reference plane; and
   sensing a stress in a vicinity of said extremity of said support with said at least one stress sensor, thereby quantitatively detecting a deformation of said deformable structure.

15. A method for sensing deformation of a microelectromechanic systems (MEMS), comprising the steps of:
   directly integrating at least one stress sensor on an extremity of a support of a deformable structure of said MEMS, said deformable structure being constructed of a polysilicon and having a reference plane, said deformable structure deforming in-plane relative to said reference plane; and
   sensing a stress in a vicinity of said extremity of said support with said at least one stress sensor, thereby quantitatively detecting a deformation of said deformable structure.

16. A deformation sensor according to claim 1 wherein said deformable structure deforms in a torsional manner.

17. A deformation sensor according to claim 1 wherein said deformable structure comprises at least one fixed-free beam.

18. A deformation sensor according to claim 1 wherein said deformable structure comprises fixed-free beams of substantially equal lengths.

19. A deformation sensor according to claim 1 wherein said deformable structure comprises fixed-free beams of different lengths.

20. A deformation sensor according to claim 1 wherein said at least one stress sensor comprises a Schottky diode.

21. A deformation sensor according to claim 1 wherein said at least one stress sensor comprises a pn junction diode.

22. A deformation sensor according to claim 1 wherein said at least one stress sensor comprises a tunnel junction diode.

23. A deformation sensor according to claim 1 wherein said at least one stress sensor comprises a bipolar transistor.

24. A deformation sensor according to claim 1 wherein said at least one stress sensor comprises a Field Effect Transistor (FET).

25. A deformation sensor according to claim 1 wherein said at least one stress sensor comprises a Metal-Oxide-Semiconductor (MOS)-FET.

26. A deformation sensor according to claim 1 wherein said single crystal material is selected from the group consisting of silicon and gallium arsenide.

27. A method according to claim 14 wherein said deformation is due to at least one of an acoustical vibration, a mechanical vibration, a pressure, a temperature change, an acceleration, an electrostatic field and a magnetic field.

* * * * *